(12) United States Patent
Dykaar

(10) Patent No.: US 9,209,019 B2
(45) Date of Patent: Dec. 8, 2015

(54) METHOD AND SYSTEM FOR MANUFACTURING A SEMI-CONDUCTING BACKPLANE

(71) Applicant: DIFTEK LASERS, INC., Waterloo (CA)

(72) Inventor: Douglas R. Dykaar, Waterloo (CA)

(73) Assignee: DIFTEK LASERS, INC., Waterloo, Ontario (CA)

( * ) Notice: Subject to any disclaimer, the term of this patent is extended or adjusted under 35 U.S.C. 154(b) by 0 days.

(21) Appl. No.: 14/019,131

(22) Filed: Sep. 5, 2013

(65) Prior Publication Data

US 2015/0064883 A1    Mar. 5, 2015

(51) Int. Cl.
*H01L 23/00* (2006.01)
*H01L 21/02* (2006.01)
*H01L 21/67* (2006.01)
*H01L 21/56* (2006.01)
(Continued)

(52) U.S. Cl.
CPC .......... *H01L 21/02422* (2013.01); *H01L 21/56* (2013.01); *H01L 21/67011* (2013.01); *H01L 21/67092* (2013.01); *H01L 21/84* (2013.01); *H01L 23/28* (2013.01); *H01L 24/11* (2013.01); *H01L 2924/15788* (2013.01)

(58) Field of Classification Search
CPC .................. H01L 21/02365; H01L 21/02367; H01L 21/20; H01L 21/58; H01L 24/15
See application file for complete search history.

(56) References Cited

U.S. PATENT DOCUMENTS

| 3,649,354 A | 3/1972 | Te Velde |
| 3,998,659 A | 12/1976 | Wakefield |
| 4,270,263 A | 6/1981 | Johnson et al. |

(Continued)

FOREIGN PATENT DOCUMENTS

| DE | 112006000411 | 2/2008 |
| EP | 1102332 A2 | 5/2001 |

(Continued)

OTHER PUBLICATIONS

McKee, William R.—Development of the Spherical Silicon Solar Cell; IEEE Transactions on Components, Hybrids and Manufacturing Technology, vol. CHMT-5, No. 4, Dec. 1982.

(Continued)

*Primary Examiner* — Cheung Lee
(74) *Attorney, Agent, or Firm* — Perry + Currier, Inc.

(57) ABSTRACT

Methods and systems to manufacture a semi-conducting backplane are described. According to one set of implementations, semi-conducting particles are positioned in a supporting material of the semi-conducting backplane utilizing perforations in the supporting material or perforations in a removable support member upon which the semi-conducting backplane is constructed. For example, semi-conducting particles are deposited in perforations on a supporting member such that a portion of the semi-conducting particles protrudes from the supporting member. Suction is applied to the semi-conducting particles to retain the semi-conducting particles in the perforations and a layer of encapsulant material is applied onto the supporting member to cover the protruding portion. The supporting member is then removed from the semi-conducting particles and the layer of encapsulant material, which together form an assembly of the semi-conducting particles and the layer of encapsulant material. The portion of the semi-conducting particles is then planarized.

20 Claims, 20 Drawing Sheets

(51) Int. Cl.
*H01L 23/28* (2006.01)
*H01L 21/84* (2006.01)

(56) References Cited

U.S. PATENT DOCUMENTS

| | | | |
|---|---|---|---|
| 4,470,874 | A | 9/1984 | Bartush et al. |
| 4,614,835 | A | 9/1986 | Carson et al. |
| 4,637,855 | A | 1/1987 | Witter et al. |
| 4,872,607 | A | 10/1989 | Jensen et al. |
| 5,069,740 | A | 12/1991 | Levine et al. |
| 5,091,319 | A | 2/1992 | Hotchkiss et al. |
| 3,025,335 | A | 3/1992 | Ralph |
| 5,377,031 | A | 12/1994 | Vu et al. |
| 5,469,020 | A | 11/1995 | Herrick |
| 5,945,725 | A | 8/1999 | Ishikawa |
| 6,204,545 | B1 | 3/2001 | Nakata |
| 6,464,890 | B2 | 10/2002 | Knappenberger et al. |
| 6,528,379 | B2 | 3/2003 | Takada et al. |
| 6,679,998 | B2 | 1/2004 | Knappenberger et al. |
| 6,744,073 | B1 | 6/2004 | Nakata |
| 7,091,073 | B2 | 8/2006 | Inoue |
| 7,205,626 | B1 | 4/2007 | Nakata |
| 7,811,839 | B2 | 10/2010 | Kasahara et al. |
| 8,575,471 | B2 | 11/2013 | Norman et al. |
| 8,999,742 | B1 * | 4/2015 | Lowenthal et al. ............ 438/63 |
| 2002/0050061 | A1 | 5/2002 | Komyoji et al. |
| 2004/0016456 | A1 | 1/2004 | Murozono et al. |
| 2007/0069642 | A1 | 3/2007 | Kitai et al. |
| 2008/0121987 | A1 | 5/2008 | Chen |
| 2010/0052511 | A1 | 3/2010 | Keesmann |
| 2010/0216076 | A1 | 8/2010 | Hong et al. |
| 2011/0186862 | A1 | 8/2011 | Harada et al. |
| 2011/0272706 | A1 | 11/2011 | Kwak et al. |

FOREIGN PATENT DOCUMENTS

| | | |
|---|---|---|
| JP | 2011181534 A | 9/2011 |
| KR | 20080104947 A | 12/2008 |
| WO | 2005024951 A1 | 3/2005 |
| WO | 2013053052 A1 | 4/2013 |

OTHER PUBLICATIONS

Y. Wang, et al. Large-area self assembled monolayers of silica microspheres formed by dip coating. Materials Science-Poland, vol. 28, No. 2, 2010.
Xia, Deying et al. Lithographically directed deposition of silica nanoparticles using spin coating. Center for High Technology Materials and Department of Electrical and Computer Engineering, University of New Mexico, 1313 Goddard SE, Albuquerque, New Mexico 87106. (Published Dec. 14, 2004).
Zhu, Ting et al. Mechanics of a process to assemble microspheres on a patterned electrode. Applied Physics Letters 88, 144101 (2006).
Victor V. Zhirnov et al. New Frontiers: Self-Assembly and Nanoelectronics. Semiconductor Research Corp. Jan. 2001.
Choi et al. TFT Backplane Technologies for AMCLD and AMOLED Applications. Journal of the Korean Physical Society, vol. 54. No. 1, Jan. 2009, pp. 549-553.
Hamer et al. 63.2: AMOLED Displays using Transfer-Printed Integrated Circuits SID Symposium Digest of Technical Papers, vol. 40 Issue 1, pp. 947-950, Jun. 2009.
Rogers et al.: Synthesis, assembly and applications of semiconductor nanomembranes; Nature, vol. 477, Sep. 1, 2001; pp. 45-51.
Tien et al.: Microfabrication through Electrostatic Self-Assembly Langmuir 1997, vol. 13, pp. 5349-5355.
Gharghi et al.: Growth and Structural Characterization of Spherical Silicon Crystals Grown from Polysilicon. Journal of Electronic Materials, vol. 37, No. 11, 2008; pp. 1657-1664.
Sakariya et al.: Vt-Shift Compensating Amorphous Silicon Pixel Circuits for Flexible OLED Displays Materials Research Society Symp. Proc. vol. 736, 2003; pp. D7.15.1 to D7.15.6.
Zhao et al: Novel Method for Fabricating Flexible Active Matrix Organic Light Emitting Diode (AMOLED) Displays Copyright 2011 Hewlett-Packard Development Company, L.P.
Kim et al.: A Review of Recent Advances in Backplanes and Color Patterning Technologies for AMOLED Display Photonics Society Newsletters, Apr. 2013.
Omae, Satoshi et al. "Crystal Characterization of Spherical Silicon Solar Cell by X-ray Diffraction" Japanese Journal of Applied Physics, vol. 45, No. 5A, 2006, pp. 3933-3937.
Gharghi, Majid, "Three-Dimensional Modeling and Simulation of p-n Junction Spherical Silicon Solar Cells", (Jun. 2006) IEEE Trans. Electron Devices, vol. 53, No. 6, pp. 1355-1363.
Related PCT/CA2012/000956 Application International Search Report, Jan. 30, 2013.
Related PCT/CA2012/000956 Application Written Opinion of the International Searching Authority, Jan. 30, 2013.
Application Note—AngstromSphere Dispersion Technique, Published by Fiber Optic Centre, Inc., 2008.
CBrite: Enabling the "displays of tomorrow", TODAY!, 2011.
Findikoglu, et al., "Aligned-Crystalline Silicon Films on Non-Single-Crystalline Substrates", Los Alamos National Laboratory publication, MRS, 2006, Report No. LA-UR-6-1165, pp. 1-11.
Kwon, Oh-Kyong, "TFT Mobility Requirement for AMOLED HDTVs" Proceedings—Electrochemical Society, PV 2004-15, pp. 146-158, 2005, Thin Film Transistor Technologies VII—Proceedings of the International Symposium <http://www.electrochem.org/dl/ma/206/symposia/pij2.htm#abs0974>.
Takeda, Nobuo, MEMS applications of Ball Semiconductor Technology, Micro Electro Mechanical Systems, 2000. MEMS 2000. The Thirteenth Annual International Conference. Jan. 23, 2000.
Related U.S. Appl. No. 13/992,063, "Office Action" dated Feb. 9, 2015.
Supplementary Parital European Search Report, Apr. 30, 2015, issued on Related European Patent Application No. EP12839944.
Talghader, Joseph J. "Integration of LEDs and VCSELs using fluidic self-assembly." Optoelectronics and High-Power Lasers & Applications. International Society for Optics and Photonics, 1998.
Vakurov et al., "Electrochemical Modeling of the Silica Nanoparticle-Biomembrane Interaction", Langmuir 2012, 28, pp. 1246-1255.
Yu, Gang, et al. "35.4 L: Late-News Paper: Metal-Oxide Thin Film Transistor with High Performance and Good Operation Stability." SID Symposium Digest of Technical Papers. vol. 42. No. 1. Blackwell Publishing Ltd, 2011.
Wirner, Christoph, "Extended European Search Report", European Patent Application No. 14182511.7, issued Jul. 14, 2015.
Gotz, Andreas, "Extended European Search Report", European Patent Application No. 12839944.1, issued Sep. 9, 2015.

* cited by examiner

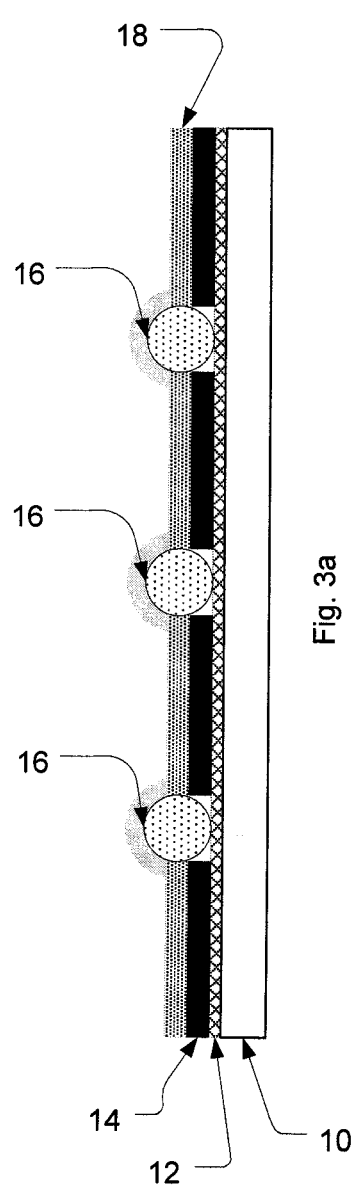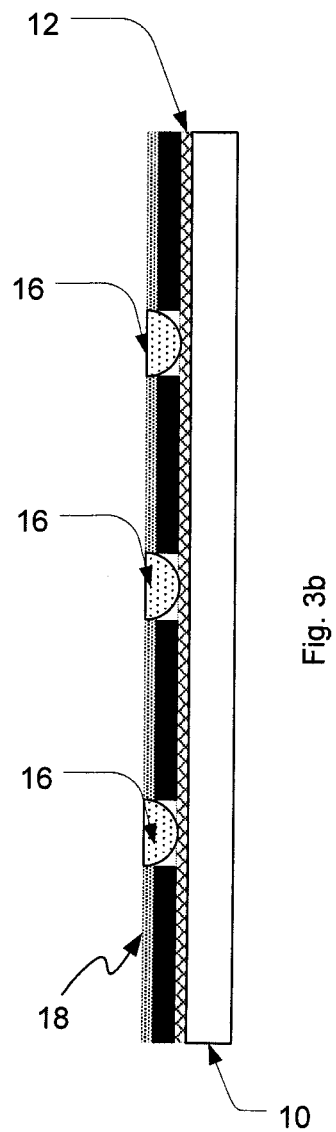

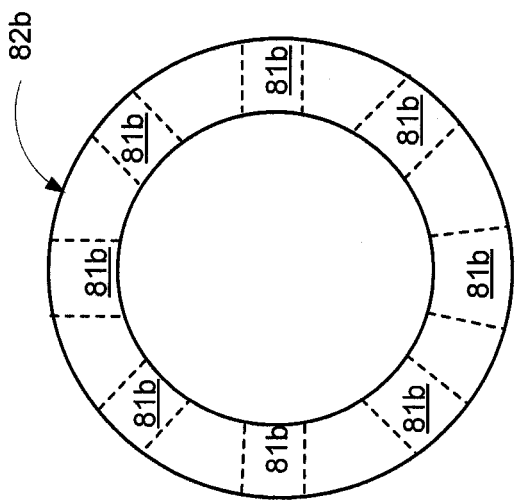
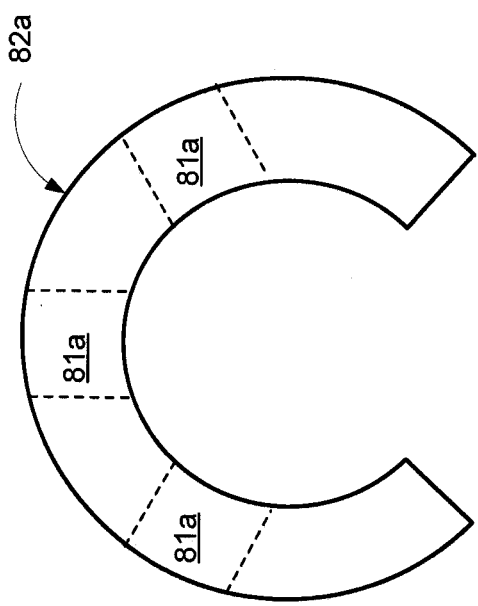
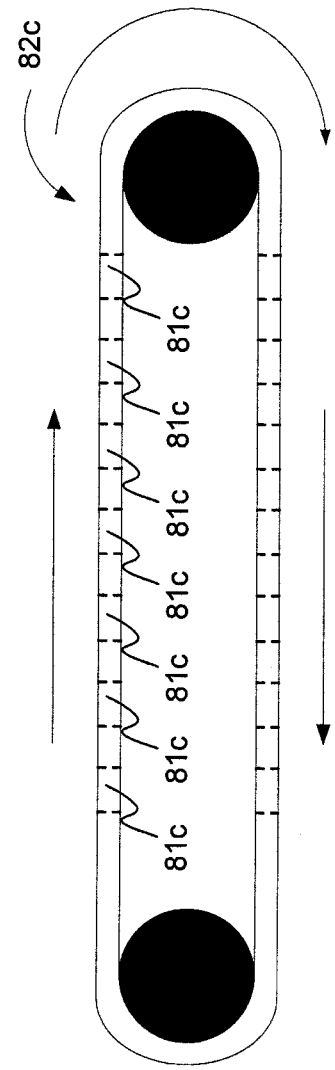
Fig. 8b
Fig. 8c
Fig. 8a

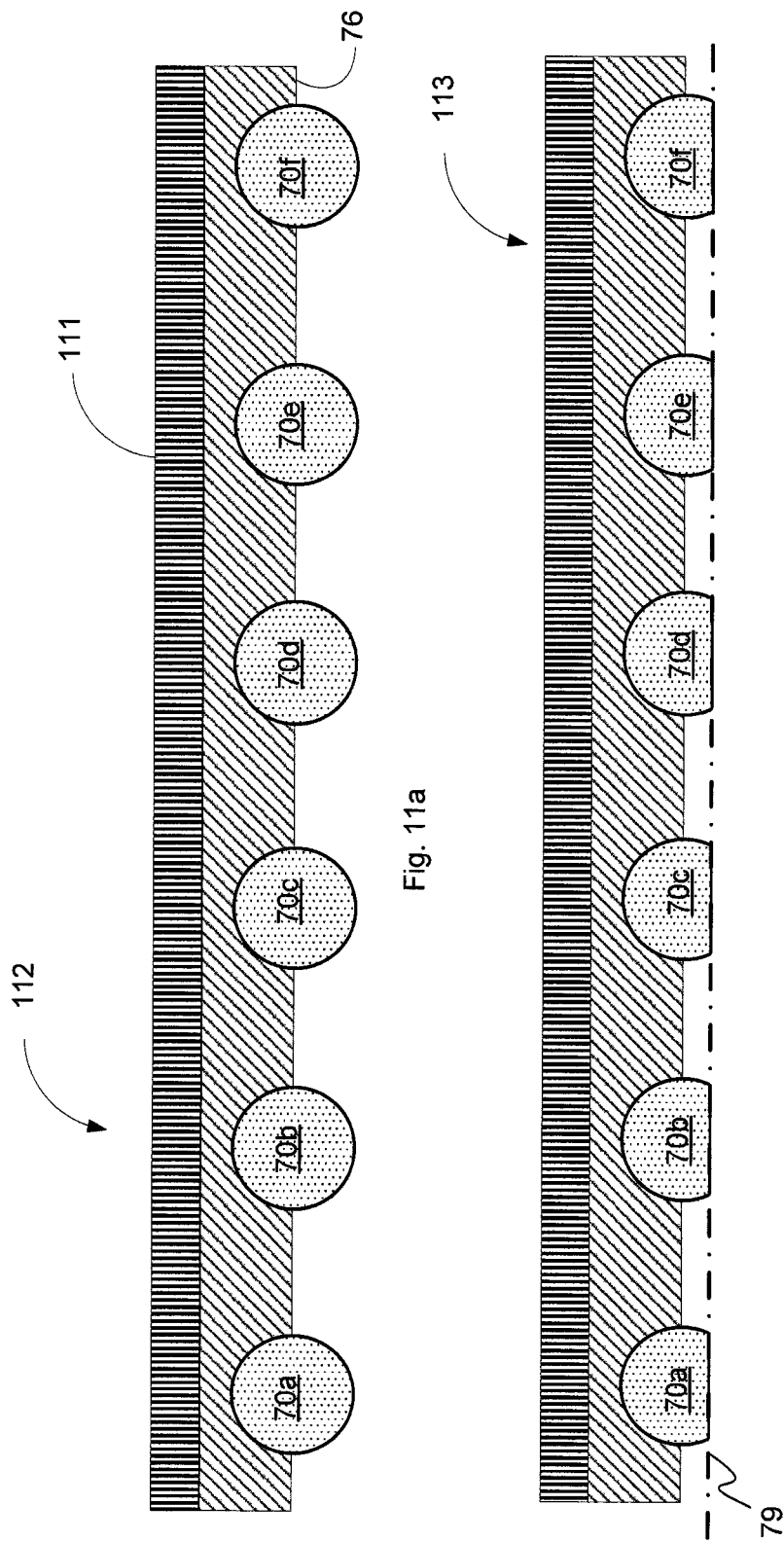

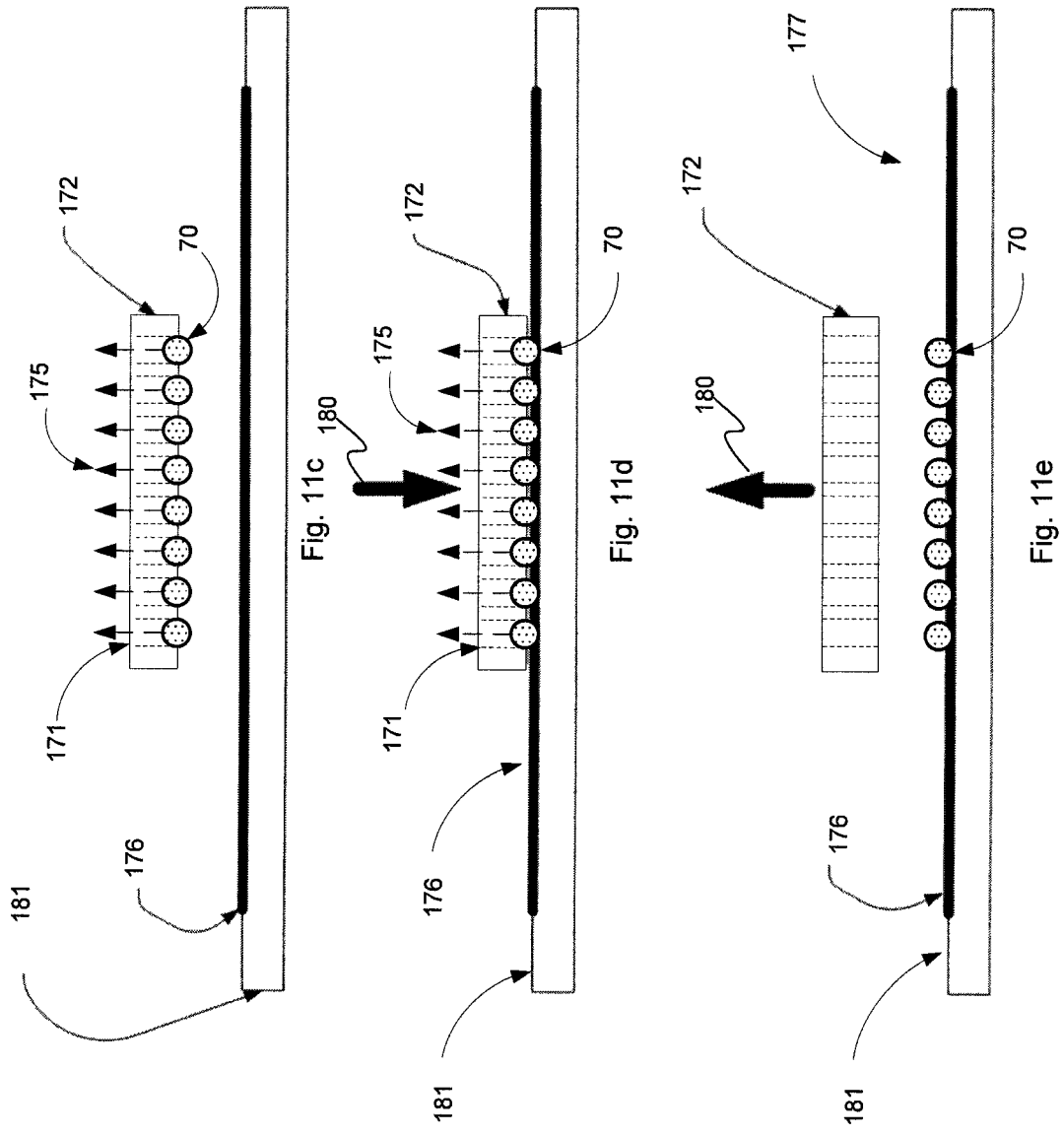

METHOD AND SYSTEM FOR MANUFACTURING A SEMI-CONDUCTING BACKPLANE

FIELD

The specification relates generally to manufacturing semi-conducting structures, and specifically to a method and system for manufacturing a semi-conducting backplane.

BACKGROUND

Single-crystal silicon is used for most electronic applications. Exceptions exist, such as displays and some imagers, where amorphous silicon is applied to glass substrates in order to operate the display or imager pixel. In many applications, the display or imager is fabricated on top of the silicon electronics. For application to liquid crystal displays (LCDs), amorphous silicon has provided sufficient performance. For next generation display devices such as Organic Light Emitting Diodes (OLED), Active Matrix (AM) drive transistors made from amorphous silicon have proven problematic. Fundamentally, LCDs use voltage devices, and Active Matrix Light Emitting Diodes (AM-OLED) require current devices. Attempts to extend the conventional approach involve modifying the prior-art amorphous-silicon on glass. Amorphous-silicon is applied to the entire substrate panel, typically greater than two meters on a side, and then is re-crystallized using large excimer lasers to scan a line focus across the panel. The laser has to be pulsed so as to only melt the Si surface and not the glass, as the glass melts at a lower temperature than Si. This technique results in the formation of poly-crystal silicon rather than single-crystal silicon.

The mobility of any type of amorphous or poly-crystalline transistor, including non-silicon and organic devices, is much smaller than the mobility of single-crystal silicon transistors. Electron mobility in amorphous silicon is approximately 1 $cm^2/V \cdot s$ compared to approximately 100 $cm^2/V \cdot s$ for poly-silicon, and approximately 1500 $cm^2/V \cdot s$ for high-quality single-crystal silicon. It can therefore be advantageous to use single-crystal silicon in place of amorphous silicon in such devices.

Placing diodes upon a curved surface of a silicon spheroid has proved to be challenging. In the prior art, attempts have been made to lithographically define structures on spherical surfaces, but this requires non-standard optics and has had limited success. Making electrical contacts to non-planar surfaces also requires nonstandard techniques. The complexities involved in fabrication have prevented any real progress.

SUMMARY

According to one implementation, there is provided a method for manufacturing a semi-conducting backplane comprising: depositing semi-conducting particles in perforations of a supporting member such that a portion of the semi-conducting particles protrudes from the supporting member; applying suction to another portion of the semi-conducting particles to retain the semi-conducting particles in the perforations; applying a layer of encapsulant material onto the supporting member such that the portion of the semi-conducting particles is covered by the layer of encapsulant material; removing the supporting member to reveal an assembly of the semi-conducting particles and the layer of encapsulant material; and planarizing the other portion of the semi-conducting particles.

According to a related implementation, the other portion lies in one of: a plane parallel to the layer of encapsulant material and a plane co-planar with the layer of encapsulant material.

According to another related implementation, planarizing comprises chemical-mechanical planarization (CMP).

According to another related implementation, applying the layer of encapsulant material comprises at least one of: spraying the encapsulant material onto the supporting member, pouring the encapsulant material onto the supporting member, spreading the encapsulant material onto the supporting member, rolling the encapsulant material onto the supporting member, pressing the encapsulant material onto the supporting member, electrostatically coating the supporting member with the encapsulant material and vacuum forming the layer of encapsulant material onto the supporting member.

According to another related implementation, the layer of encapsulant material comprises at least one of: a fluid, a powder and a sheet.

According to another related implementation, the layer of encapsulant material comprises at least one of: glass, plastic and optically curable cement.

According to another related implementation, the method further comprises, prior to the removing, applying a layer of substrate material over the layer of encapsulant material. According to an implementation, the assembly further includes the layer of substrate material. According to an implementation, the layer of substrate material comprises at least one of: glass, flex-glass and plastic.

According to another related implementation, the method further comprises removing the layer of encapsulant material after the planarizing.

According to one implementation, there is provided a system for manufacturing a semi-conducting backplane comprising: a supporting member having perforations therein sized to receive semi-conducting particles such that a portion of the semi-conducting particles protrudes from the supporting member; a suction apparatus, operatively coupled to the supporting member, for applying suction to another portion of the semi-conducting particles to retain the semi-conducting particles in the perforations; an applicator for applying a layer of encapsulant material onto the supporting member such that the portion of the semi-conducting particles is covered by the layer of encapsulant material; and a planarizing apparatus for planarizing the other portion of the semi-conducting particles.

According to another implementation, there is provided a method for manufacturing a semi-conducting backplane comprising: providing a substrate having perforations under suction; depositing semi-conducting particles in the perforations such that a portion of the semi-conducting particles protrudes from the substrate, the semi-conducting particles being retained in the perforations by the suction; adhering the substrate to the semi-conducting particles to form an assembly of the substrate and the semi-conducting particles; and planarizing the portion of the semi-conducting particles.

According to a related implementation, the substrate is provided to a supporting member configured to apply the suction to the perforations.

According to a related implementation, the planarized portion lies in one of: a plane parallel to the substrate of the assembly and a plane co-planar with the substrate of the assembly.

According to a related implementation, planarizing comprises chemical-mechanical planarization (CMP).

According to a related implementation, adhering the substrate to the semi-conducting particles comprises at least one of: applying an adhesive to the perforations; applying an adhesive to the semi-conducting particles; heating the substrate; curing the substrate; and fusing an oxide layer on the semi-conducting particles to the substrate.

According to a related implementation, the method further comprises removing the assembly from the supporting member.

According to a related implementation, the supporting member comprises one of a planar member, a conveyor or a drum.

According to a related implementation, the semi-conducting particles comprise silicon spheres.

According to a related implementation, the substrate comprises at least one of: glass, flex-glass and plastic.

According to another related implementation, the method further comprises removing the substrate after the planarizing.

According to another implementation, there is provided a system for manufacturing a semi-conducting backplane comprising: a supporting surface configured to provide suction to perforations of a substrate; a depositing apparatus for depositing semi-conducting particles in the perforations under suction, the semi-conducting particles being retained in the perforations by the suction such that a portion of the semi-conducting particles protrudes from the substrate; an apparatus for adhering the substrate to the semi-conducting particles to form an assembly of the substrate and the semi-conducting particles; and a planarizing apparatus for planarizing the portion of the semi-conducting particles.

BRIEF DESCRIPTIONS OF THE DRAWINGS

For a better understanding of the various implementations described herein and to show more clearly how they may be carried into effect, reference will now be made, by way of example only, to the accompanying drawings in which:

FIG. 3a depicts a cross-sectional view of semiconducting spherical particles deposited on a gridded substrate having a conformal coating deposited on top of the spherical particles, according to a first set of non-limiting implementations;

FIG. 3b depicts a cross-sectional view of the semiconducting spherical particles shown in FIG. 3a after being planarized, according to a first set of non-limiting implementations;

FIGS. 8a to 8c depict a supporting member for manufacturing a semi-conducting backplane, according to a second set of non-limiting implementations;

FIGS. 11a and 11b depict a method of manufacturing a semi-conducting backplane that includes a layer of substrate material, according to a second set of non-limiting implementations;

FIGS. 11c to 11e depict a method of manufacturing a semi-conducting backplane, according to a second set of non-limiting implementations;

DETAILED DESCRIPTION

Figure 1:
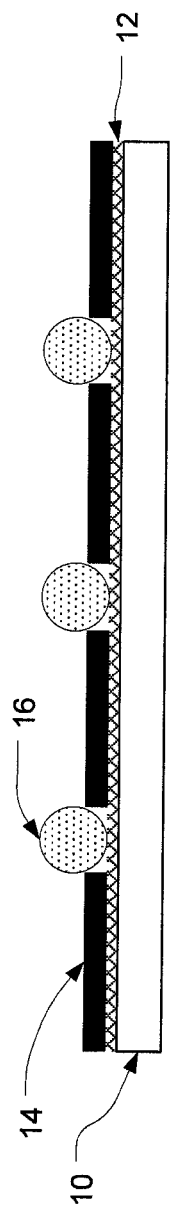
FIG. 1 depicts a cross-sectional view of an array of semi-conducting spheres placed adhesively upon a substrate so as to permanently affix the spheres at predetermined locations, according to a first set of non-limiting implementations.

Described herein are methods and systems to manufacture a semi-conducting backplane (also referred to herein as "a semi-conducting device"). According to a first set of implementations, a plurality of planarized semi-conducting particles are located at predetermined locations upon a substrate to form localized regions suitable for planar electronic device fabrication on, in, or under a region of the planarized surface. According to a second set of implementations, the semi-conducting particles are positioned in a supporting material of the semi-conducting backplane utilizing perforations in the supporting material or perforations in a member used as a releasable or removable support upon which the semi-conducting backplane is constructed.

According to a first subset of the second set of implementations, semi-conducting particles are deposited in perforations on a supporting member such that a portion of the semi-conducting particles protrudes from the supporting member. Suction is applied to the semi-conducting particles to retain the semi-conducting particles in the perforations and a layer of encapsulant material is applied onto the supporting member to cover the protruding portion of the semi-conducting particles. The supporting member is then removed from the semi-conducting particles and the layer of encapsulant material, which together form an assembly of the semi-conducting particles and the layer of encapsulant material. The portion of the semi-conducting particles is planarized to form the semi-conducting backplane.

According to a second set subset of the second set of implementations, a substrate having perforations under suction is provided and semi-conducting particles are deposited in the perforations of the substrate such that a portion of the semi-conducting particles protrudes from the substrate and the semi-conducting particles are retained in the perforations by the suction. The substrate is adhered to the semi-conducting particles to form an assembly of the substrate and the semi-conducting particles and the portion of the semi-conducting particles is planarized.

It is understood that for the purpose of this disclosure, language of "at least one of X, Y, and Z" and "one or more of X, Y and Z" can be construed as X only, Y only, Z only, or any combination of two or more items X, Y, and Z (e.g., XYZ, XYY, YZ, ZZ).

As stated above, it can be advantageous to use single-crystal silicon in place of amorphous silicon in various devices, such as flat panel displays. According to some implementations, a plurality of planar single-crystal silicon regions on a non-silicon substrate at predetermined locations, for the purpose of electronic device fabrication is fabricated. For example, wafers of single crystal silicon are too costly for large displays and too small in size: Silicon wafers are typically 300 mm in diameter, compared to current LCD panels at more than 2 meters on a side. By comparison, approximately spherical particles, spheres or spheroidal particles of single-crystal silicon have been manufactured in large sizes less than or equal to 2 mm, which is large compared to individual pixel sizes. U.S. Pat. No. 4,637,855, incorporated herein by reference, entitled Process For Producing Crystalline Spherical Spheres, Filed Apr. 30, 1985 in the names of Witter et al., describes the manufacture of crystalline spheres.

Furthermore, in regards to fabricating electrical contacts to non-planar surfaces, curved surfaces of Si spheres have also been doped with an n-type dopant to form n-type Si surrounding a p-type Si region which comprises the majority of the surface of a sphere. Some implementations relate to the field of photovoltaic devices, in that the planar surface and region directly below can be doped for example with an n-type dopant and a region below with a p-type dopant so as to form a solar cell. A silicon sphere solar cell is described in a paper entitled Crystal Characterization of Spherical Silicon Solar Cell by X-ray Diffraction by Satoshi OMAE, Takashi MINEMOTO, Mikio MUROZONO, Hideyuki T AKAKURA and Yoshihiro HAMAKA W A, Japanese Journal of Applied Physics Vol. 45, No. SA, 2006, pp. 3933-3937 #2006 The Japan Society of Applied Physics.

At least some implementations of the described methods, systems and devices overcome limitations of the aforementioned prior art by conveniently utilizing the surface area and region about the planar surface on a planarized particle to fabricate electronic devices. A planar region having structures formed therein provides a convenient reliable way in which to provide electrical contacts to different parts of the device.

Furthermore, at least some of implementations can enable technology that has a smaller carbon footprint by allowing circuits to be built that consume less power than similar circuitry which utilizes LCD technology.

For example, some implementations can enable production of large OLED panels, which are more efficient that LCD panels. OLED pixels emit at the desired color, R, G, or B only, so no energy is wasted creating other colors, which are then filtered out and which produce waste in the form of heat. In addition, the OLED emitters can be fabricated on top of the backplane electronics, so the emission area can be maximized without blocking light emitting areas of the pixel. By placing the backplane electronics out of the light path, the design can be optimized for speed and low-power dissipation, as opposed to being compromised for light path requirements.

It is noted that electronic devices formed on or directly under these planarized surfaces include, but are not limited to, transistors, diodes, capacitors, non-linear resistors, temperature sensors, interconnects, vias that may be formed by doping the planarized sphere or subsequently overlaid on the planarized surface such as OLEDs or AMOLEDs or photodetectors. Furthermore, implementations allow a functional device, such as a transistor, to be formed on a planar surface of a single sphere.

Turning now to FIG. 1 which depicts a cross-sectional view of an array of semi-conducting spheres placed adhesively upon a substrate so as to permanently affix the spheres at predetermined locations, according to non-limiting implementations of the first set of implementations. Substrate 10 may be plastic, glass, semiconductor material or any other suitable stable material for supporting an electronic circuit. An adhesive layer 12 is applied to an upper surface of the substrate 10 which has a grid 14 having predetermined gaps between grid elements suitably sized to contain semi-conducting spheres 16, having a diameter of less than 15 mm and preferably less than 2 mm. The term "semi-conducting sphere", used hereafter, is to include spheres, spheroids and semi-conducting sphere-like objects which may have imperfections, due to defects in forming the spheres. The arrangement shown in FIG. 1 conveniently allows a circuit designer to have a great deal of control in determining where spherical semiconducting material is to be located, and as a result, where semiconductor devices residing on planar surfaces of the spheres 16 are to be fabricated after the spheres are planarized. Although the grid is shown with same spacing between grid openings, a grid having non-uniform spacing can be used to locate spheres in any desired pattern. If the electronic devices were fabricated on the planar surfaces prior to positioning the spheres on the substrate, orienting the spheres would be very difficult. Therefore, the spheres 16 are first fixedly attached to the substrate 10 and are subsequently planarized so as to expose regions of high quality semiconductor material within the interior of the sphere suitable for fabrication of silicon electronics; by way of example, CMOS devices can be formed at the planar layer by doping the material of the sphere at the planar layer and beneath. Spherical particles are described in detail and are particularly convenient to position and planarize, however many other particle shapes can be used, as long as the particles can be positioned and secured to a substrate conveniently and as long as the particles can be planarized so as to provide a planar or flat surface on which to fabricate electronic devices.

Typically, for most chip-based electronics, the unused chip area is reduced to a minimum so the device density is high. The density is so high, that the unused substrate area wasted by not having an active device fabricated thereon is small. In displays and imagers, the device area is specified by requirements that are not electronic. As a result, as the displays become larger, the device density becomes lower. At some point, coating several square meters with low-quality Si to make a few devices, or a few million compared to 100s of millions in a PC CPU, is no longer desirable. In accordance with the described methods, systems and devices, high-quality Si is placed only where it is needed, thereby covering a lower fraction of the total display area for large displays. This technological inflection point should occur as a result of the impending crossover to OLED displays. OLEDs are current devices, and amorphous silicon on glass cannot deliver the required current and speed.

Silicon spheres have been used previously to manufacture large area photo-voltaic panels as described in U.S. Pat. No. 4,614,835 Photovoltaic Solar Arrays Using Silicon Microparticles, filed Dec. 30, 1983, in the names of Carson et al, incorporated herein by reference. For photovoltaic applications the surface of the sphere forms the active area. Silicon spheres can be made from low cost powdered silicon and the resulting re-crystallized surface layer of silicon dioxide can getter significant impurities. Repeated melting cycles can improve the overall material purity. Even in the case of polycrystalline particles, the electron mobility is many times that of amorphous silicon.

In accordance with some implementations, it was discovered that for electronic devices, it is preferable to fabricate devices using the flat surface of a cross section of a semiconductor particle such as a sphere rather than the curved outer surface. The flat surface allows the use of standard lithography techniques, allowing the fabrication of transistors, interconnects, etc. For example, a silicon sphere 20 microns in diameter, provides a maximum area, $A=\pi \times r^2=$approximately 314 microns$^2$ for device fabrication. Many transistors with gate lengths on the order of 1 micron can be fabricated within such an area. For large area displays, only a few transistors are required for each pixel and pixel size doesn't scale with display size; High Definition (HD) is a standard resolution (e.g. 1920×1080 pixels). In addition, one flat area of high quality, single-crystal silicon can service more than one pixel, as well as provide added functionality such as self-test and display performance monitoring and correction, if provided with a sensor such as a photodetector or temperature sensor.

The use of the flat cross section of a planarized particle such as a truncated planarized sphere allows the use of standard photolithographic fabrication techniques. Furthermore, by planarizing, imperfections that occur on the surface of the sphere or spheroid are removed as the sphere or spheroid is etched or polished to expose the inner region. Conveniently, because the spheres are purified in a separate process, high-purity single-crystal material can be realized using high temperature processes not available to amorphous silicon on glass substrates as the glass substrate melts at temperatures lower than standard silicon processing temperatures. This is even more important for lower melting temperature substrates such as plastics. Truncated spheres or planarized particles of other shapes can be doped, or multiply doped just below or above their planar surface to form rings of n-type and p-type material or "wells" when the cross section is exposed; doping can also occur later in the process. This will allow the fabrication of CMOS devices as is shown in FIG. 5. Although a preferred way in which to dope a region is by ion implantation, doping can also be achieved by spin-coating dopants onto the planarized surface. The outer surface can be highly doped or metalized to form a substrate contact that can be contacted from either the edge of the top surface or from anywhere on the spherical surface, which is the effective backside. The term contact used in this specification can be a physical wire, or a metalized contact region such as a conductive contact pad whereby a lead or wire or device can make electrical contact.

According to some of the first set of implementations, spherical silicon particles are provided at known locations on a substrate, such as a non-silicon substrate. Positioning the silicon spheres on a substrate can be done by any of several techniques. According to some of the first set of implementations, the substrate is patterned with a plurality of locations in which spheres are to be placed. Metal or dielectric grids can be permanently or temporarily applied to the substrate first, or standard photolithographic techniques can be used. Alternatively dots, dimples, or other patterns of adhesive can be applied to locate the spheres. Adhesive material with a melting point or adhesive at room temperature appropriately matched to subsequent electronic processing should be chosen. As an alternative to a deposited or applied grid, the substrate can be patterned directly, using standard lithographic techniques to make holes in the substrate in which to deposit adhesive for fixing the semi-conductor spheres.

According to some of the first set of implementations, silicon particles can be used to form a monolayer on the substrate surface in substitution for non-semiconducting spheres used to form a mask, described in U.S. Pat. Nos. 6,464,890, and 6,679,998 Knappenberger et al. filed Aug. 29, 2001 and August 23 respectively, incorporated herein by reference. As long as the particles are a predetermined size, then subsequent processing can provide for planarized silicon particles such as spherical particles in the required locations.

Figure 2:
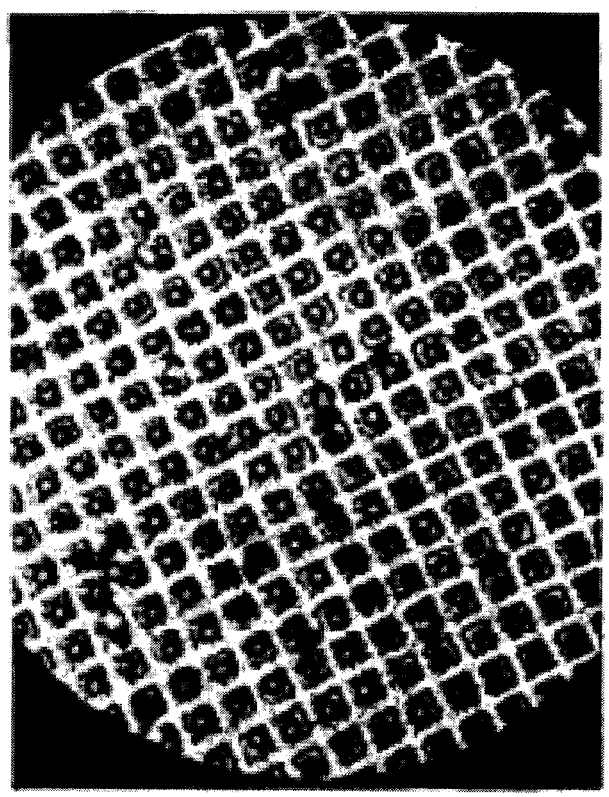
FIG. 2 depicts a photograph of an array of single-crystal Si spheres disposed upon a non-silicon substrate, according to a first set of non-limiting implementations.

In FIG. 1 an exemplary technique is shown whereby a grid 14 is used with an adhesive layer 12. According to some implementations, grid 14 comprises a metal grid. Spheres 16 are subsequently placed on the surface in sufficient quantity such that the use of mechanical vibration to move the spheres around on the grid results in complete occupation of the grid openings. The mechanical vibration causes the spheres 16 to move around the volume defined by the substrate, walls and a cover. In a very short time, the spheres 16 move around to such a degree that the probability of encountering an available grid location is unity, as long as spheres are still available. FIG. 2 shows a photomicrograph of such a device made on a glass substrate with a grid. In this exemplary case, glass spheres are used and are 20 microns in diameter. Mechanical vibration was used to move the glass spheres around on the grid. High voltage (V≤12 kV) was then applied to the grid to help remove spheres from the top surface of the grid. Some excess spheres and dirt can also be seen, but these would be reduced or eliminated in a clean room environment and/or removed in subsequent processing steps.

For large areas, spheres can be applied in a dense line across the surface in one direction and then vibrated across the surface of the substrate in a wave.

Alternatively, electric fields can be applied using external electrodes in order to move the particles on the substrate as described in "Mechanics of a process to assemble microspheres on a patterned electrode," Ting Zhua, Zhigang Suob, Adam Winkleman and George M. Whitesides, APPLIED PHYSICS LETTERS 88, 144101 (2006), hereafter referred to as Reference 1. In this approach an electric potential is created using a bottom electrode placed underneath the dielectric substrate and the conductive grid is used as the counter electrode. The holes in the grid create a potential well that the spheres can drop down into. The electric field gradient around the hole is sufficient to create a net force acting on the particle. For large enough applied fields (kV), the particles can be moved into the holes. Vibration may be required initially, to move the spheres around so that they encounter the potential well.

In another approach, a similar process to that used in laser printing can be utilized. In laser printers, triboelectrically generated charge is applied to toner particles. The charged toner particles are then applied to an electrostatically charged (drum) substrate. In laser printing the toner particles are then transferred to an electrostatically charged substrate typically paper. In laser printing the laser is used to write the pattern on the charged drum, but since the pattern wouldn't change in a production environment, the laser can be replaced by a grid. In first generation laser printers, toner particle size of approximately 16 microns was on the same order as the spheres of FIG. 2. By applying a voltage to an electrode underneath the dielectric substrate to attract the charged spheres, and the opposite polarity to the grid, the spheres are selectively attracted to the holes. This approach can be viewed as an enhancement of the approach described in Reference 1.

According to another of the first set of implementations, the array of spheres could then be transferred from the first substrate, acting similarly to laser printer drum, to another, un-patterned substrate, acting similarly to the charged paper, in a complete analogy to laser printing described. Alternatively, transferring of the array of spheres from first to second substrates can also be accomplished if the adhesive on the second, un-patterned substrate, or adhesive applied to the spheres has a higher melting temperature, greater adhesion or electrostatic attraction, for example. While the exemplary device of FIG. 1 uses an adhesive layer, the substrate or grid under layer can be a heat softened layer, such as thermoplastic layer at elevated temperature so the spheres adhere on contact and remain in place when the substrate is cooled to ambient temperature. The adhesive can be a thin layer applied to substrate. The relatively small size of the spheres means that significant contact area is achieved for a small layer thickness of adhesive.

Since silicon has a higher melting temperature than glass, a glass substrate can be used directly if sufficiently heated to soften the glass and so allow the spheres, either coated with silicon dioxide or stripped of oxide, to adhere directly to the glass, providing an assembly that can be subjected to higher post-processing temperatures. This can be accomplished by transferring the arrayed particles from a patterned substrate onto un-patterned glass using electrostatic attraction, as in laser printing. By fixing the particles directly to the glass the window for higher temperature processing can be extended to the point where the cross sectional interior of the semiconducting spheres is exposed. The same printing process can be used for other substrates.

Once the spheres 16 are in place, a conformal coating 18 is applied and subsequently planarized using a modification of the standard planarization techniques, such as chemo-mechanical polishing/planarization (CMP), as shown in FIG. 3a where the conformal coating 18 of $SiO_2$ is shown covering the spheres 16 and the grid 14. FIG. 3b shows the same array of spheres 16 after planarization and before devices are fabricated on the truncated spheres 16 in the form of hemispheres. Standard planarization techniques used in integrated circuit fabrication can be utilized. Planarization can occur multiple times in the process because as multiple layers are deposited sequentially, the topography can exceed that supported by the process, therefore after a conformal dielectric coating is applied it is then planarized; and when a conductive coating is applied it is then planarized. Connections between layers are made by opening holes or vias at lithographically defined locations and depositing conductive connections or plugs between layers. This is particularly advantageous. In the case of a planarized metal layer, the layer would be patterned to form the required interconnects. In the described implementations, the process of planarization is performed to expose the interior cross-section of the semiconductor particles, as opposed to the prior art of planarizing the surface without exposing all of the underlying elements, as described in U.S. Pat. No. 4,470,874, entitled Planarization of multi-level interconnected metallization system, filed Dec. 15, 1983, incorporated herein by reference.

Although the silicon spheres are placed with random orientation, the anisotropy of mobility in Si is small, so the resulting devices that are fabricated will be much higher performance than those made using amorphous- or poly-silicon. However, if the application is less demanding and for example does not require high-speed devices, then poly-silicon or non-spherical particles can be used.

Other forms of semi-conducting particles can be utilized. For example, powdered silicon can be used, either single- or poly-crystal, if appropriate to the performance requirements of a particular application. In addition, multiple placement cycles can be used to place particles of different sizes, or different material characteristics, such as doping or crystalline quality or atomic species, such for example GaAs, or quaternary alloys for use as optical sources, or SiGe, to realize different functionality in the final device.

Figure 5A:
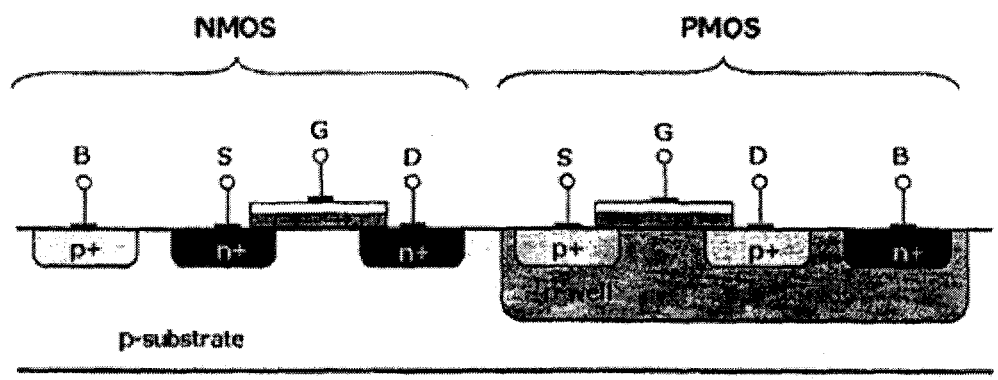
FIG. 5a depicts a partial cross-sectional view of complementary NMOS and PMOS circuits formed on a planarized semiconducting particle doped with a p-type material when forming the particle, according to a first set of non-limiting implementations.
Figure 5B:
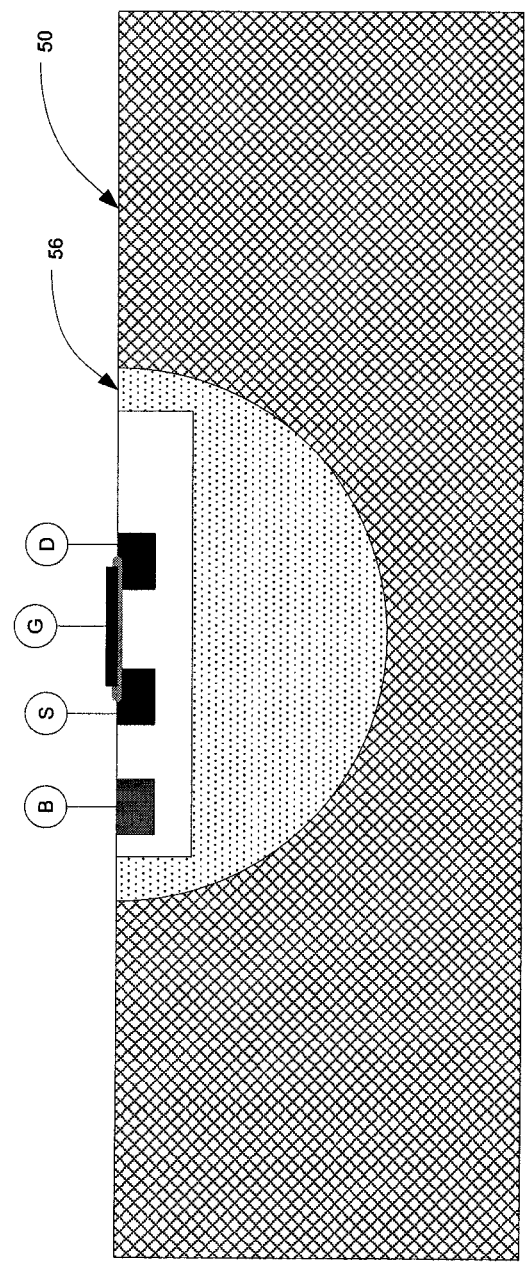
FIG. 5b depicts a cross-sectional view of a single transistor device fabricated within a single planarized sphere, according to a first set of non-limiting implementations.

Standard photolithographic techniques can be used to fabricate devices on the exposed silicon surfaces as well as fabrication of interconnects and other elements required for device functionality. Implementations of the described methods, systems and devices allow for nearly conventional CMOS devices to be fabricated; and, it may be advantageous to utilize other processes. According to some implementations, the type of process that can be used is not restricted. For example, particles of n and p type silicon can be deposited in separate steps, to achieve n- and p-wells using separate silicon particles. In conventional CMOS, the n-well shown in FIG. 5a must be fabricated within the global p-type substrate. Turning now to FIG. 5b, a device similar to that of FIG. 5a is shown fabricated within a spherical particle that is doped with a p-type material for form a p-type sphere. In this figure a semi-spherical semiconductor device 50 is shown wherein a planarized sphere 56 forms a gated semiconductor transistor device having a source (S), drain (D) and Gate (G) as well a contact B which forms a substrate bias as the device is within a doped well, as shown. In this instance a single device is formed within the planarized semiconducting sphere. Each of the lines extending from the device to B, S, D, and G are electrical contacts. The number of separate devices that can be manufactured on within/upon a single crystal particle depends greatly on the size of the planarized region. For example if the device has a 1 µm gate length and 1 µm via holes, the entire device maybe 5 µm×5 µm device. However, a sphere with a 20 µm diameter would have a surface area of greater than 300 µm² which could accommodate several devices. By way of example a 2×2 pixel array or a single pixel with additional circuitry for example for lifetime-control could be inbuilt. Considerations of sphere size could be cost, reliability and yield. The device shown in FIG. 5a could be fabricated on any or all of the planarized spheres shown for example in FIG. 3b.

Figure 5C:
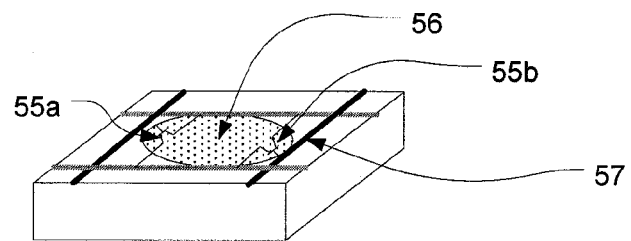
FIG. 5c depicts an isometric view of a circuit with symbolic representation of gated transistors shown in a planarized spherical particle, according to a first set of non-limiting implementations.
Figure 5D:
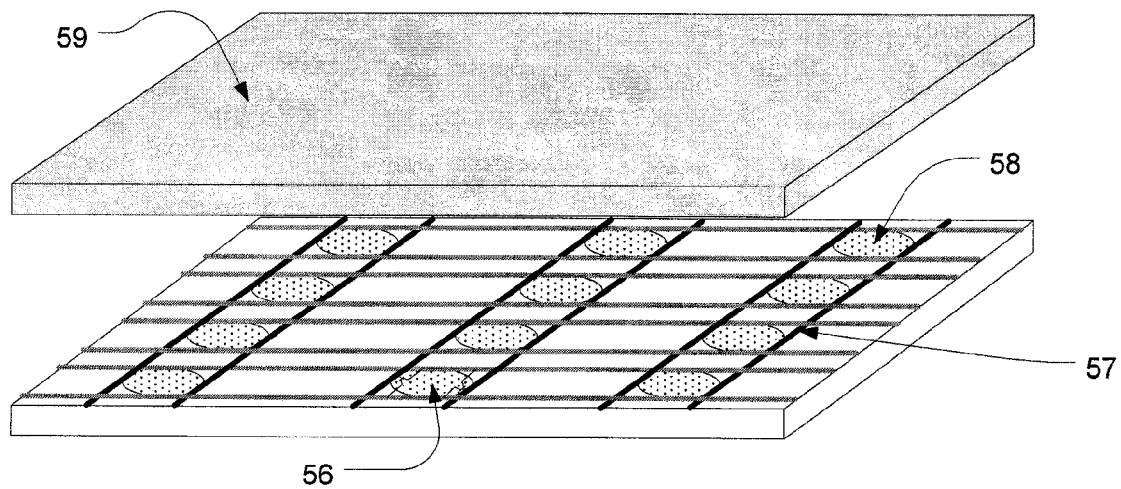
FIG. 5d depicts the spherical particle of FIG. 5b as one in an array of such particles that can be manufactured according to a first set non-limiting implementations.

A symbolic representation of transistors 55a, 55b is shown in FIGS. 5c and 5d. The depicted single cell could also form a standalone circuit, be packaged and function as a standalone device, replacing a similar device fabricated on a silicon wafer. Further doping occurs to achieve the NMOS and PMOS devices in the same sphere. In FIG. 5c an array of controllable functional devices such as transistors 55a, 55b can be fabricated. Although not shown in the array 58 of planarized spheres 56 (with interconnects 57), an array of devices would be manufactured within the same process. That is, doping would be done to all transistors at the same time. A passivation layer 59 is applied directly over top of the planarized spheres after devices are fabricated. The passivation layer 59 is shown before it is laid down over the active devices. Although an advantage of the described methods and systems is that an array of any size can be manufactured it may be desired to cut up the array into smaller functional units which can be placed in desired locations. Current means for cutting silicon wafers can be used in this instance.

The resulting electronic assembly can then be used as the basis for a variety of devices such as displays, or imagers.

According to some implementations, non-glass substrates, such as plastic, Mylar, polyimide or other application appropriate material, can also be used, allowing not only decreased cost of production, but also the realization of both flexible and moldable devices. As the dimensions of the semiconductor particle are reduced, the minimum bend radius is also reduced. For silicon particles, which are smaller than the substrate thickness, the mechanical properties will be largely dictated by the non-silicon elements of the device and so can be made either flexible or moldable or a combination thereof. Devices can also be fabricated where the mechanical properties vary throughout the device, where the mechanical stiffness is specified as a function of position within the device.

According to some implementations, large substrates can be cut to form small devices, in the same way that silicon wafers are cut into devices of a preferred size; the device is small relative to the substrate. The present techniques would be applicable where the costs and performance allowed the use of non-silicon substrates. In many silicon devices for example, the area occupied by the contact pads and interconnects can be on the same order as the device area. In other applications, device performance can be enhanced by using a substrate with a large thermal conductivity. Here the spherical backside of the particle provides a larger surface through which heat can be removed.

Figure 4A:
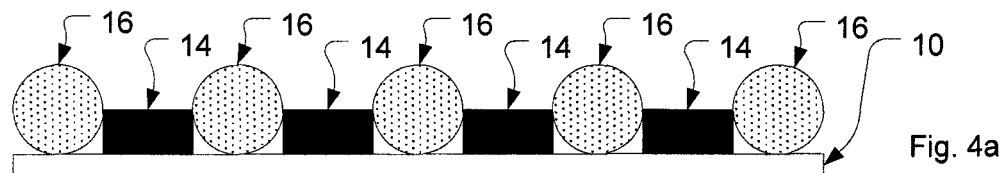
FIGS. 4a to 4f depict a method of forming contacts on the planar surface and to the outside surface of a sphere for example, for providing an array of solar cells, according to a first set of non-limiting implementations.
Figure 4B:
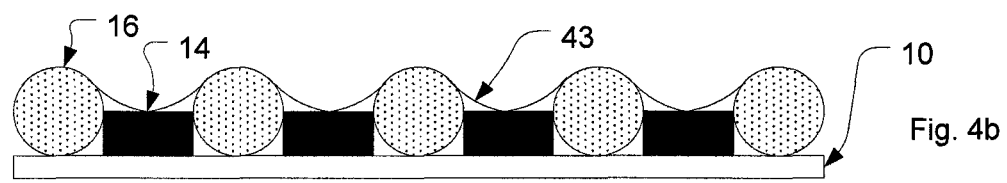
Figure 4C:
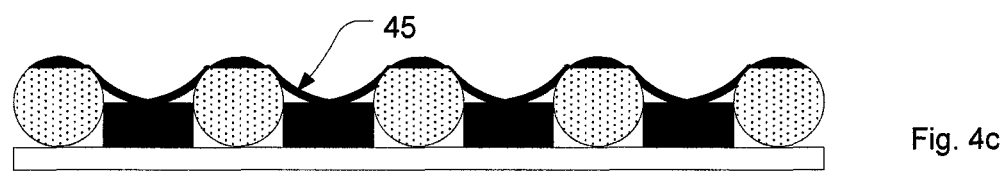
Figure 4D:
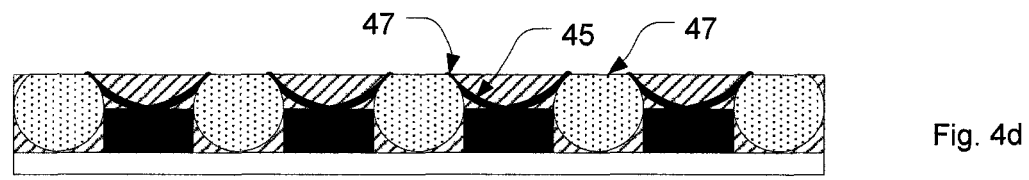
Figure 4E:
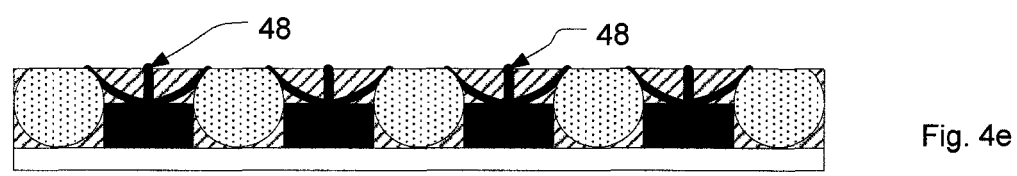
Figure 4F:
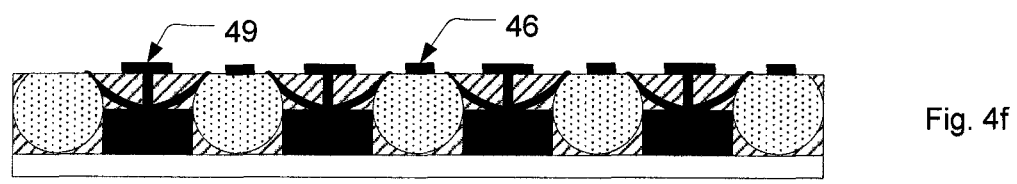

As was mentioned heretofore, the described methods, systems and devices also allow for the manufacture of solar cells using a similar fabrication method. Turning now to FIGS. 4*a* through 4*f* a process of manufacturing solar cells is shown, wherein spheres 16 doped with p-type material shown in FIG. 4*a* are located in openings with a grid 14 and are fixed to the substrate 10 they are supported by. According to some implementations, substrate 10 is light transmissive. In FIG. 4*b* the spheres and grid are coated in a layer 43 of $SiO_2$ and in FIG. 4*c* a metallization layer 45 is applied. In FIG. 4*d* the structure is planarized and the spheres have planar upper surfaces 47. In FIG. 4*e* vias and conducting plug formation 48 is provided. Also not shown in FIG. 4*e*, the planar region just below the planar surface is doped with n-type material and in a subsequent step in FIG. 4*f* interconnects 46 and 49 are formed so that all interconnects are on the planar upper surface which contact the p and n material. This upper planarized surface actually forms the backside of solar the panel.

In some implementations of the first set of implementations, the term planarized particle or particle having a planar surface refers to particles that have a longest dimension across the planar surface of 15 mm and a depth (d) of at least 1 μm normal to the planar surface. Preferably these particles are spheres, spheroids or imperfect spheres or spheroids. However other particle shapes are within the scope of the first and second set of implementations. FIGS. 6*a* through 6*d* illustrate various particle shapes 60 and show depth (d) normal to the planar surface of the particle.

Figure 7A:
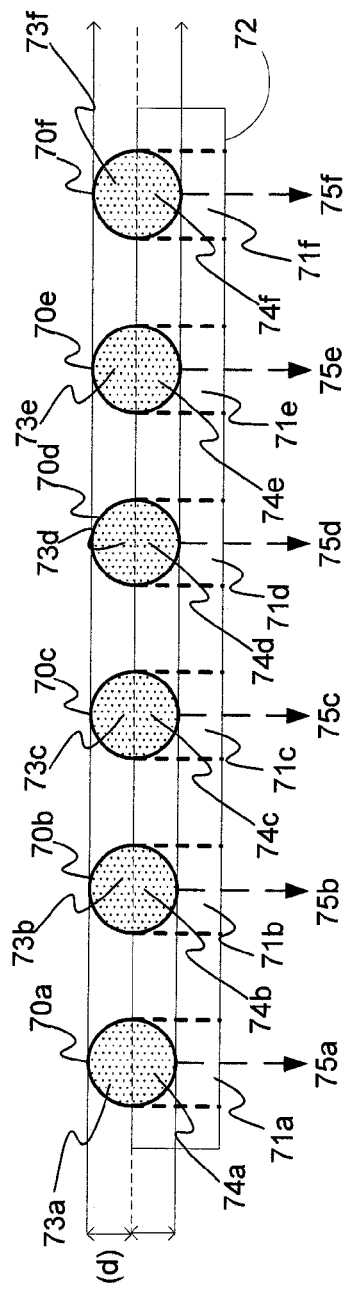
FIGS. 7a to 7c depict a method of manufacturing a semi-conducting backplane, according to a second set of non-limiting implementations.
Figure 7B:
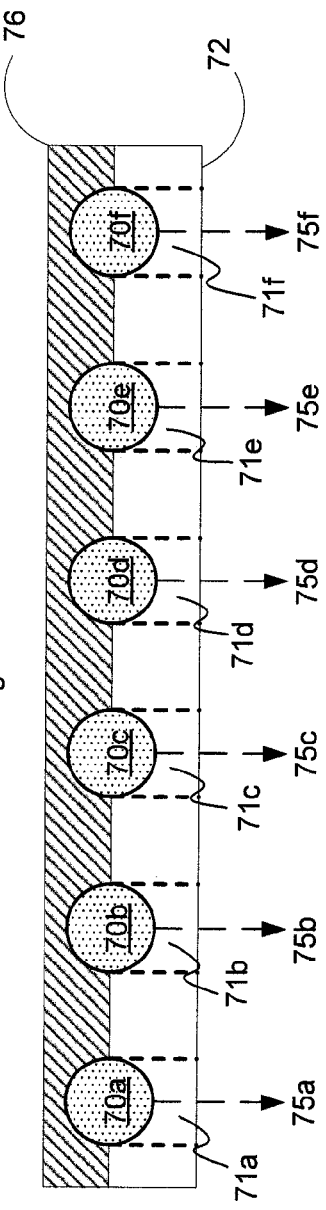
Figure 7C:
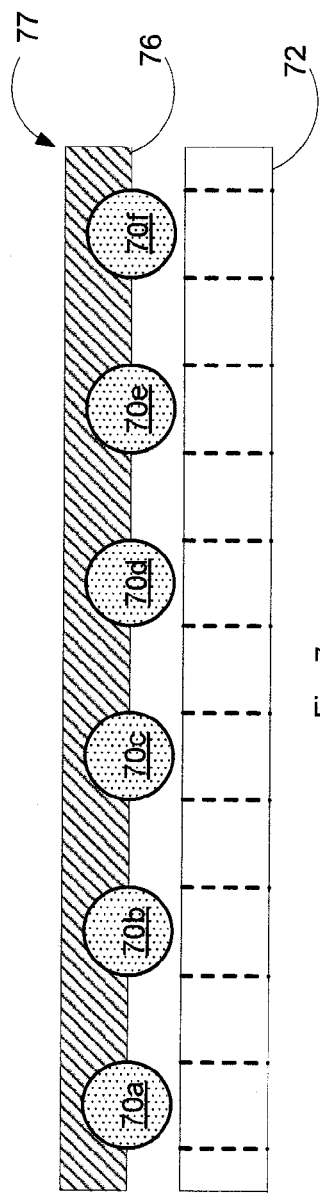

Attention is now directed to FIGS. 7*a* to 7*c*, which depicts a method of manufacturing a semi-conducting backplane according to non-limiting implementations of a subset of the second set of implementations. Semi-conducting particles 70*a*, 70*b*, 70*c*, 70*d*, 70*e* and 70*f*, also referred to herein as semi-conducting particles 70 and depicted as spheres, are deposited in respective perforations 71*a*, 71*b*, 71*c*, 71*d*, 71*e*, 71*f*, also referred to herein as perforations 71, of supporting member 72. Similarly to the first set of implementations, semi-conducting particles 70 can be deposited in perforations 71 by mechanical vibration of supporting member 72. Semi-conducting particles 70 can also be deposited in perforations 71 by individually placing each of semi-conducting particles 70*a*, 70*b*, 70*c*, 70*d*, 70*e* and 70*f* in respective perforations 71*a*, 71*b*, 71*c*, 71*d*, 71*e* and 71*f*. However, this list is not exhaustive and any suitable means of depositing the semi-conducting particles 70 in perforations 71 is contemplated.

Figure 6A:
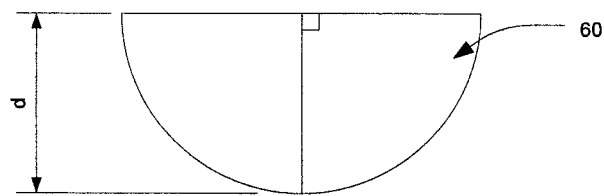
FIGS. 6a to 6d are cross-sectional views of particles wherein the maximum depth is shown normal to a planarized surface, according to a first set of non-limiting implementations.
Figure 6B:
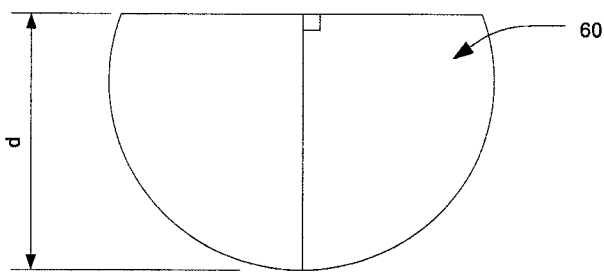
Figure 6C:
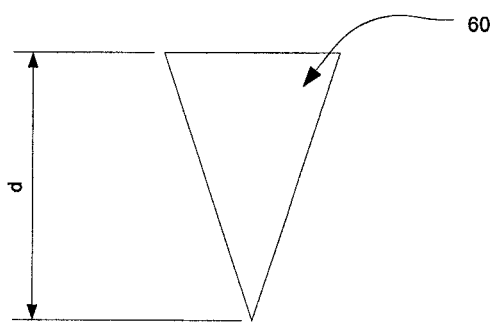
Figure 6D:
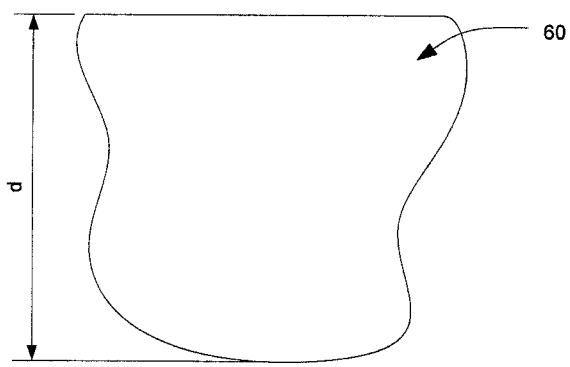

Although FIGS. 7*a* to 7*c* depict a plurality of semi-conducting particles, according to some implementations, a single semi-conducting particle is disposed in a single perforation of the supporting member. Furthermore, although semi-conducting particles 70 comprise spheres, as in the first set of implementations, the shape and form of each one of semi-conducting particles 70 can comprise various particle shapes. Examples of the various shapes of semi-conducting particles 70 are depicted in FIGS. 6*a* to 6*d*. As in the first set of implementations, semi-conducting particles 70 can comprise a variety of materials, such as silicon dioxide, powdered silicon, either single- or poly-crystal, if appropriate to the performance requirements of a particular application. For example, semi-conducting particles 70 can comprise silicon spheres. According to implementations, semi-conducting particles 70 are the same in size and/or shape. According to some implementations, semi-conducting particles 70 comprise a variety of shapes and/or sizes. For example, semi-conducting particle 70*a* can comprise a triangular shape (as depicted by FIG. 6*c*), semi-conducting particle 70*c* can comprise an irregular shape (as depicted by FIG. 6*d*) and the remaining semi-conducting particles 70*b*, 70*d*, 70*e* and 70*f* can comprise spheres or spheroids of various sizes.

Supporting member 72 is used as a supporting structure for the manufacture of a semi-conducting backplane. Supporting member 72 can comprise various shapes, configurations and sizes. According to some implementations, supporting member 72 comprises one of a hollow cylinder or drum, a substantially solid cylinder or drum, a planar member, a curved member and a conveyor member. FIGS. 8*a* and 8*b*, in which like elements are denoted by like or similar numbers to FIGS. 7*a* to 7*c*, however starting with a "8" rather than a "7", depict a few examples of shapes for a supporting member according to non-limiting implementations. For example, supporting members 82*a*, 82*b* and 82*c* correspond to supporting member 72 fabricated according to other non-limiting implementations. In FIGS. 8*a* to 8*c*, supporting member 82*a* comprises a curved member, supporting member 82*b* comprises a hollow cylinder and supporting member 82*c* comprises a perforated conveyor. It is noted that supporting members 82*a*, 82*b* and 82*c* are provided merely for illustration and other configurations for the described supporting member are contemplated.

Supporting member 72 can comprise a variety of materials. For example, supporting member can comprise one of steel and ceramic. The application for the semi-conducting backplane, the particular manufacturing conditions and the "heat budget" or temperature constraints of the materials used to form the semi-conducting backplane can inform the material of supporting member 72.

Figure 9:
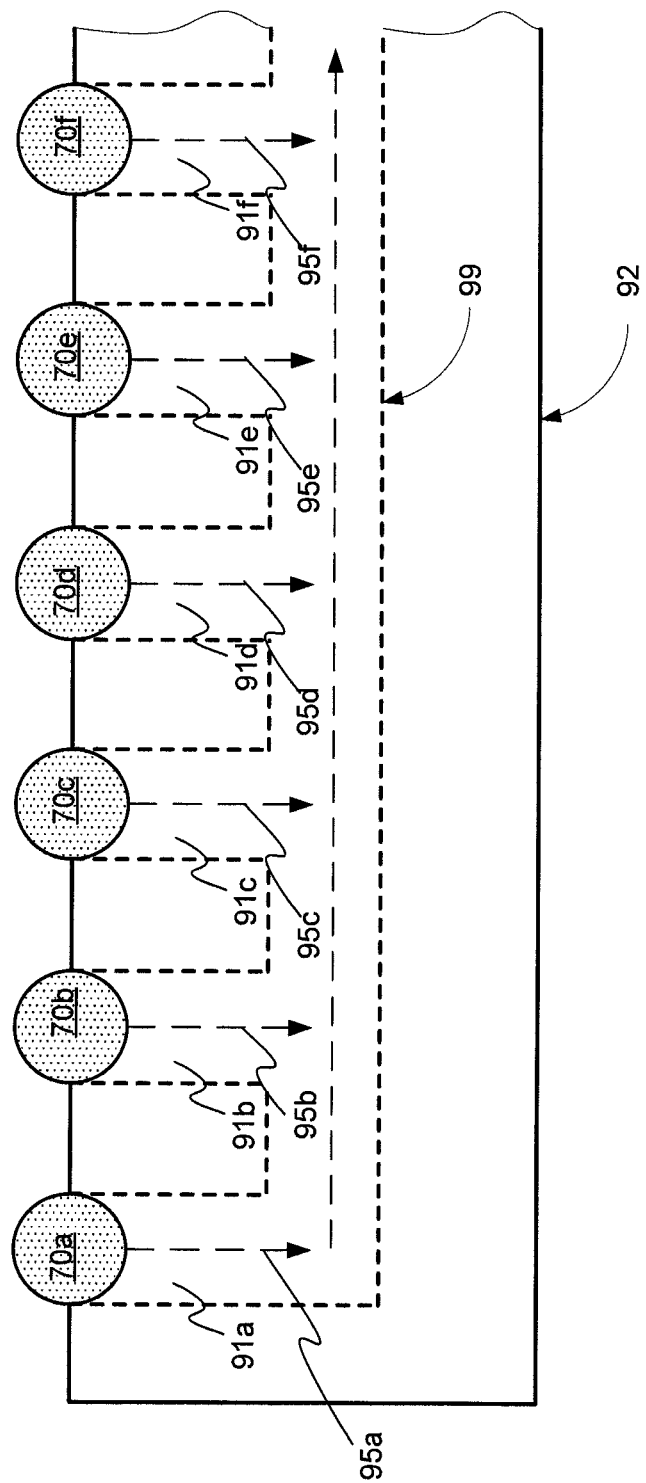
FIG. 9 depicts a supporting member for manufacturing a semi-conducting backplane, according to a second set of non-limiting implementations.

Perforations 71 are depicted as through-thickness holes in FIGS. 7*a* to 7*c*. However, any perforations that would enable suction to be applied to other portion 74 is contemplated. Hence, according to some implementations perforations 71 may only penetrate supporting member 72 to a depth less than through-thickness. For example, as depicted in FIG. 9, in which like elements are denoted by like or similar numbers to FIGS. 7a to 7c, however starting with a "9" rather than a "7", perforations 91 may be connected together by duct 99 such that pressure gradient force 95 (described below) is generated in each of perforations 91a, 91b, 91c, 91d, 91e and 91f via duct 99.

Furthermore, the number and arrangement of perforations 71 across supporting member 72 can vary. According to some implementations, perforations 71 comprise a single perforation (such as respective perforation 71a). According to some implementations, perforations 71 are uniformly spaced across supporting member 72. According to some implementations, perforations 71 are arranged non-uniformly across supporting member 72. According to some implementations, perforations 71 are positioned at pre-determined locations across supporting member 72. For example, if the semi-conducting backplane will be used to manufacture a display, perforations 71 will be located at positions where transistors or other electrical connections would be connected to the semi-conducting particles 70.

According to some implementations, perforations 71 have varying sizes and shapes. Perforations 71 are arranged in any manner suitable for application, manufacture and/or transportation of the semi-conducting backplane. According to some implementations, multiple devices are to be manufactured from the same semi-conducting backplane. In such implementations, the semi-conducting backplane may be divided into areas or zones representing each respective device. If the devices are disparate devices (e.g. different dimensions, emission requirements, power requirements, etc.), each area or zone may require semi-conducting particles of different sizes, compositions and/or shapes. Hence, in these implementations, perforations 71 may be differently arranged and/or sized in each zone. The semi-conducting backplane may then be separated by each area or zone, such as by cutting up the semi-conducting backplane, for further manufacturing of the respective device.

Perforations 71 are sized to receive semi-conducting particles 70 such that a portion 73 (respectively portions 73a, 73b, 73c, 73d, 73e and 73f for semi-conducting particles 70a, 70b, 70c, 70d, 70e, 70f) protrudes from supporting member 72. According to some implementations, supporting member 72 is sized (e.g. made thin enough) such that more than one portion of semi-conducting particles 70 protrudes from supporting member 72 through perforations 71. For example, according to some implementations, supporting member 72 is thin enough in respect of semi-conducting particles 70 such that at least a part of portion 73 and at least a part of other portion 74 protrudes from supporting member 72. The amount portion 73 protrudes from supporting member 72, such as a distance (d), may depend on the application for the semi-conducting backplane, configuration and/or design requirements for the device utilizing the semi-conducting backplane. Furthermore, perforations 71 are sized such that semi-conducting particles 70 do not pass through perforations 71.

Suction is applied to another portion 74 (also referred to herein as "other portion 74") of semi-conducting particles 70 (respectively other portion 74a, 74b, 74c, 74d, 74e and 74f of semi-conducting particles 70a,70b, 70c, 70d, 70e and 70f) to retain semi-conducting particles 70 in perforations 71. It is noted that the "suction" described herein is a pressure gradient force 75 (also referred to herein as pressure gradient forces 75a, 75b, 75c, 75d, 75e and 75f) generated by a pressure differential between the region surrounding other portion 74 in perforations 71 and another region in fluid communication with perforations 71. For example, the other region could be a low pressure chamber in a vacuum apparatus that is operatively coupled to supporting member 72 and/or perforations 71. As depicted in FIGS. 7a and 7b, pressure gradient force 75 draws or compels semi-conducting particles 70 towards and into perforations 71, which helps prevent the semi-conducting particles 70 from being released or moving out of respective perforations 71a, 71b, 71c, 71d, 71e and 71f. It is noted that perforations 71 are configured to enable suction to be applied to other portion 74, allowing for a variety of arrangements. As will be understood, other portion 74 comprises an area or region of semi-conducting particles 70 that, depending on the application, could be locations for electrical connections. It is also understood that in FIGS. 8a to 8c, perforations 81a, perforations 81b and perforations 81c are also similarly configured to perforations 71.

As depicted in FIG. 7b, a layer of encapsulant material 76 is applied onto supporting member 72 that portion 73 of semi-conducting particles 70 is covered by layer of encapsulant material 76. The other portion 74 of semi-conducting particles 70 is largely shielded from contact and/or adhesion with the layer of encapsulant material 76. The layer of encapsulant material 76 supports and joins semi-conducting particles 70 together (e.g. in cooperation with each other) in the semi-conducting backplane. According to some implementations, the layer of encapsulant material 76 can be optically transmissive or opaque. According to some implementations, the layer of encapsulant material 76 is divided into areas or zones of varying optical transmissibility and/or composition. As stated above, according to some implementations, multiple devices can be manufactured from the same semi-conducting backplane and divided into areas or zones for the respective devices. In such implementations, characteristics of the layer of encapsulant material can also be varied according to such zones, including the composition, optical transmissibility, and/or thickness.

The layer of encapsulant material 76 can take a variety of forms. According to some implementations, the layer of encapsulant material 76 comprises a fluid. According to some implementations, the layer of encapsulant material 76 comprises one of a powder, a sheet or membrane. According to some implementations, the layer of encapsulant material 76 comprises one or more of a fluid, a powder and a sheet. For example, the layer of encapsulant material can comprise a sheet of gel. Depending on the application of the semi-conducting backplane, desired characteristics and composition of the layer of encapsulant material 76, it may be desirable to fluidize the layer of encapsulant material 76. According to some implementations, after the layer of encapsulant material 76 is applied, the layer of encapsulant material 76, comprising one of a powder and a sheet, is fluidized. According to some implementations, the fluidizing comprises one of melting the layer of encapsulant material 76 and polymerizing the layer of encapsulant material 76. For example, melting the layer of encapsulant material 76 comprises heating supporting member 72.

The layer of encapsulant material can also comprise a variety of substances. According to some implementations, the layer of encapsulant material 76 comprises one of glass, plastic and optically curable cement.

The form and composition of the layer of encapsulant material 76 can be varied based on desired characteristics of the semi-conducting backplane. For example, a flexible semi-conducting backplane may be desirable to facilitate transportation. According to some implementations, the semi-conducting backplane is flexible enough to be rolled. In rolled form, the semi-conducting backplane may take up less space per unit surface area than a typical rigid panel and hence is easier to transport. According to some implementations, the layer of encapsulant material 76 can be fabricated to promote flexibility in the semi-conducting backplane by making the layer of encapsulant material 76 thin relative to other dimensions of the layer of encapsulant material 76 (e.g. length and width) and/or choosing a substance that promotes flexibility, such as a flexible polymer.

According to some implementations, the layer of encapsulant material 76 is treated to promote adhesion to the semi-conducting particles 70. For example, glue or epoxy can be applied the layer of encapsulant material 76, comprising a sheet of encapsulant material 76, at the locations of the portion 73 of semi-conducting particles 70. Alternately or additionally, the semi-conducting particles 70 are treated to promote adhesion to or bonding with the layer of encapsulant material 76. For example, a glue or an epoxy may be applied to at least a part of portion 73 of semi-conducting particles 70.

Although reference is made to "a" layer, the layer of encapsulant material 76 may be comprised of a plurality of layers of encapsulant material. For example, the layer of encapsulant material 76 may be progressively built up by applying thinner layers of encapsulant material until the desired thickness and form for the layer of encapsulant material 76 is achieved. In another non-limiting example, in order to achieve the desired characteristics, the layer of encapsulant material 76 can comprise multiple layers of encapsulant material in which each layer comprised of a different substance or state.

Application of the layer of encapsulant material 76 can take a variety of forms. According to some implementations, applying the layer of encapsulant material 76 comprises one of: spraying the encapsulant material onto the supporting member 72, pouring the encapsulant material onto the supporting member 72, spreading the encapsulant material onto the supporting member 72, rolling the encapsulant material onto the supporting member 72, pressing the encapsulant material onto the supporting member 72, electrostatically coating the supporting member with the encapsulant material and vacuum forming the layer of encapsulant material onto the supporting member.

As depicted by FIG. 7c, the supporting member 72 is released or removed to reveal an assembly 77 of the semi-conducting particles and the layer of encapsulant material 76. The "releasing" can comprise separating the supporting member 72 from the assembly 77 or vice-versa (separating the assembly 77 from supporting member 72). In order to facilitate the releasing, prior to applying the layer of encapsulant material 76, supporting member 72 may be treated with a substance or composition to promote releasing (herein also referred to as a "releasant"). For example, supporting member 72 may be coated with a non-stick coating, such as Teflon® of DuPont (E.I. du Pont de Nemours). According to some implementations, the supporting member 72 can be removed in pieces, rather than as a single piece. For example, if the semi-conducting backplane is being used to fabricate multiple devices, in some related implementations the supporting member 72 may be removed or released as areas or zones of the assembly 77 associated with the semi-conducting backplane are being utilized. Depending on how supporting member 72 is released and/or the strength of pressure gradient force 75, the suction or pressure gradient force 75 may be removed prior to releasing the supporting member 72.

Furthermore, as depicted by FIG. 7c, since the other portion 74 is shielded from contact and/or adhesion with the layer of encapsulant material, there is no need to remove encapsulant material from the semi-conducting particles 70 in order to expose at least a part of the semi-conducting particles 70 for further processing. According to some prior art methods, the semi-conducting particles are completely enveloped by encapsulant material and/or substrate material and therefore require use of lithography or other techniques to carefully remove enough encapsulant material and/or substrate material to expose the semi-conducting particles without damaging any of the semi-conducting particles. Implementations of the described methods and systems therefore obviate this additional step, leading to reduced manufacturing costs in comparison to those prior art methods.

Figure 10:
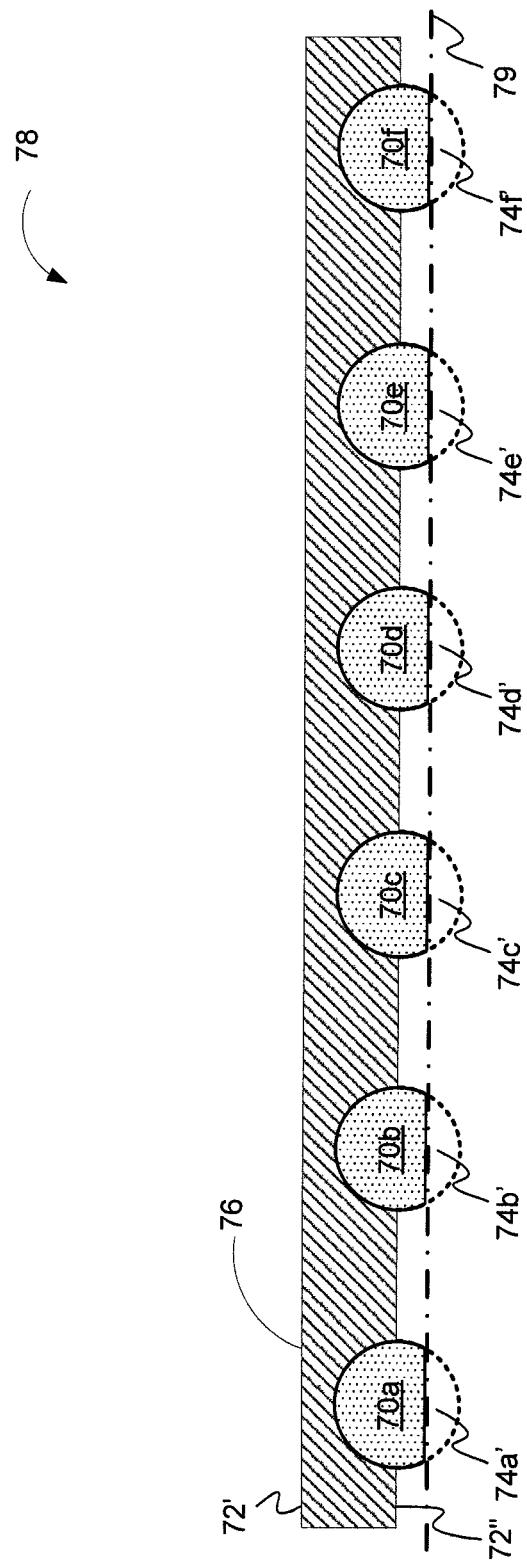
FIG. 10 depicts a semi-conducting backplane, according to a second set of non-limiting implementations.

Attention is directed to FIG. 10, which depicts assembly 77 after at least a part of the other portion 74 of the semi-conducting particles 70 have been planarized to form the semi-conducting backplane 78. The amount of part of other portion 74 removed by planarizing, denoted by 74', ma y depend on the application of the semi-conducting backplane 78, including the electrical connections that may be made to the semi-conducting particles 70. A variety of planarizing techniques a can be utilized. According to some implementations, the planarizing comprises chemical mechanical planarization (CMP). According to some implementations, the planarizing comprises sanding and/or grinding the semi-conducting particles 70. According to some implementations, the semi-conducting particles 70 are further processed by laser recrystallization after planarizing.

As depicted in FIG. 10, the planarizing of semi-conducting particles 70 can be performed in a plane parallel to the layer of encapsulant material 76, depicted as plane 79. It is noted that layer of encapsulant material 76 of the assembly 77 is generally planar or flat after being released from supporting member 72. According to some implementations, plane 79 is in the same plane (e.g. co-planar) as the layer of encapsulant material 76. For example, plane 79 may lie in the same plane as surface 72' or surface 72" of the layer of encapsulant material 76. Having plane 79 in the same plane as the layer of encapsulant material 76 (e.g. surface 72") may be desirable based on the techniques used to fabricate devices on the semiconductor. For example, lithography generally uses masks to expose regions of photosensitive material on the surface of the layer of encapsulant material. Subsequent development of the photosensitive material or photoresist exposes regions of the layer of encapsulant material for further processing. This type of photolithographic process is typically used in semiconductor processing and generally requires a planar surface, where planarity is limited by the ability of the photolithographic tools to form an image on the surface regardless of the topography of the layer of encapsulant material. Planarity may still be necessary even if alternative techniques such as ink jet printing are used.

According to some implementations, semi-conducting particles 70 are planarized along two planes, a first plane parallel to or co-planar with surface 72' and a second plane parallel to surface 72" such that the semi-conducting particles 70 are planarized on two sides or surfaces. Planarizing semi-conducting particles 70 on two sides exposes semi-conducting surfaces of semi-conducting particles 70 on two surfaces, allowing for fabrication of devices, interconnects and electrical vias to be formed on both sides of the device. For example, electronics could be placed on one planarized surface of semi-conducting particles 70, and active contact pads (such as contact pads with ESD protection and drive transistors) on the other planarized surface of semi-conducting particles 70, where the two planarized surfaces are connected by electrical vias made in the semiconductor or in the remaining surrounding layer of encapsulant material 76. The resulting overall device is more compact as area normally used for contact pads can now be used for circuitry.

Furthermore, the electrical devices can be diced to form individual die. The contact pads are not necessarily be wire bond pads, but can be used for die-attach, ball bonds, or other standard method to directly attach to a printed circuit board (PCB).

According to one related implementation, electrical devices formed using semi-conducting backplane 78 can be diced to form individual die, and after attachment to a PCB or other carrier, the remaining layer of encapsulant material 76 can be subsequently removed, by any convenient means such as dissolving or melting the remaining layer of encapsulant material 76 leaving behind the now smaller, mounted and electrically connected device.

According to some implementations, the electrical dices or semi-conducting backplanes can be stacked.

In some cases, it is preferable to have a semi-conducting backplane with greater structural rigidity than solely provided by the layer of encapsulant material 76. Referring to FIGS. 11a and 11b, in which like elements are denoted by like numbers in FIGS. 7a to 7c, according to some implementations, a layer of substrate material 111 is applied over the layer of encapsulant material 76. The layer of substrate material 111 provides further structural support and rigidity to semi-conducting backplane 113 (depicted in FIG. 11b) by virtue of its composition and/or thickness relative to the layer of encapsulant material 76.

The layer of substrate material 111 can take a variety of forms. For example, the layer of substrate material 111 can comprise a fluid, a solid sheet and a powder.

According to some implementations, the layer of substrate material 111 is applied prior to releasing or removing supporting member 72 to reveal assembly 112, which then comprises the semi-conducting particles 70, the layer of encapsulant material 76 and the layer of substrate material 111. According to some implementations, applying the layer of substrate material 111 comprises one of pressing the substrate material onto the layer of encapsulant material 76, pouring the substrate material onto the layer of the encapsulant material 76, flowing the substrate material onto the layer of encapsulant material 76, spraying the substrate material onto the layer of encapsulant material 76 and rolling the layer substrate material 111 onto the layer of encapsulant material 76. According to some implementations, the layer of substrate material 111 comprises one of: glass, flex-glass and plastic.

In order to harden, solidify and/or promote adhesion between the semi-conducting particles 70 and the layer of encapsulant material 76, in some implementations, the layer of encapsulant material 76 is cured. Likewise, in order to harden, solidify and/or promote adhesion between the layer of encapsulant material 76 and the layer of substrate material 111, one or more of the layer of encapsulant material 76 and the layer of substrate material 111 is cured. Furthermore, in order to promote adhesion between the layer of encapsulant material 76 and the layer of substrate material 111, an adhesive is applied to one or more of the layer of encapsulant material 76 and the layer of substrate material 111. Depending on the composition and properties of the layer of encapsulant material 76 and the layer substrate material 111, the curing can, for example, comprise heating, exposure to ultraviolet radiation and/or applying suitable chemical additives to the layer of encapsulant material 76 and/or the layer of substrate material 111.

Attention is directed to FIGS. 11c to 11e, which depicts the manufacture of a semi-conducting backplane, according to non-limiting implementations, and in which like or similar elements depicted in FIGS. 7a to 11b are indicated with like or similar numerals.

Semi-conducting particles 70 are deposited in perforations 171 in supporting member 172 such that a portion of the semi-conducting particles 70 protrudes from supporting member 172. Suction 175 or pressure gradient force 175 is applied to another portion of the semi-conducting particles 70 to retain the semi-conducting particles 70 in perforations 171. According to some implementations, the semi-conducting particles 70 are pre-loaded onto the supporting member 172 before being transported or otherwise moved into a position for adhering or affixing to a layer of encapsulant material 176. According to some implementations, an adhesive is applied to the protruding portion of the semi-conducting particles 70.

The layer of encapsulant material 176 is applied onto a layer of substrate material 111. The layer of encapsulant material 176 can comprise, for example, spin-on glass that has been partially baked to be tacky or UV curable cement. According to some implementations, the layer of substrate material 181 is replaced with another member provided for the purpose of positioning and supporting the layer of encapsulant material 176 during the manufacture of the semi-conducting backplane. According to those implementations, the member is released or otherwise removed after the forming of assembly 177 (described below).

As depicted in FIGS. 11d and 11e, supporting member 172, carrying the semi-conducting particles 70, is pressed onto the layer of encapsulant material 176 (denoted by directional arrow 180). Supporting member 172 is then released or removed from the assembly 177 of the semi-conducting particles 70, the layer of encapsulant material 176 and the layer of substrate material 181. In the depicted implementations, suction 175 or pressure gradient force 175 is removed in order to release the supporting member 172 from the assembly 177. According to some implementations, the layer of encapsulant material 176 is cured and/or baked to solidify and help adhere the layer of encapsulant material 176 to the semi-conducting particles 70 and/or the layer of substrate material 181. The semi-conducting particles 70 of assembly 177 are then planarized as described herein.

Figure 12:
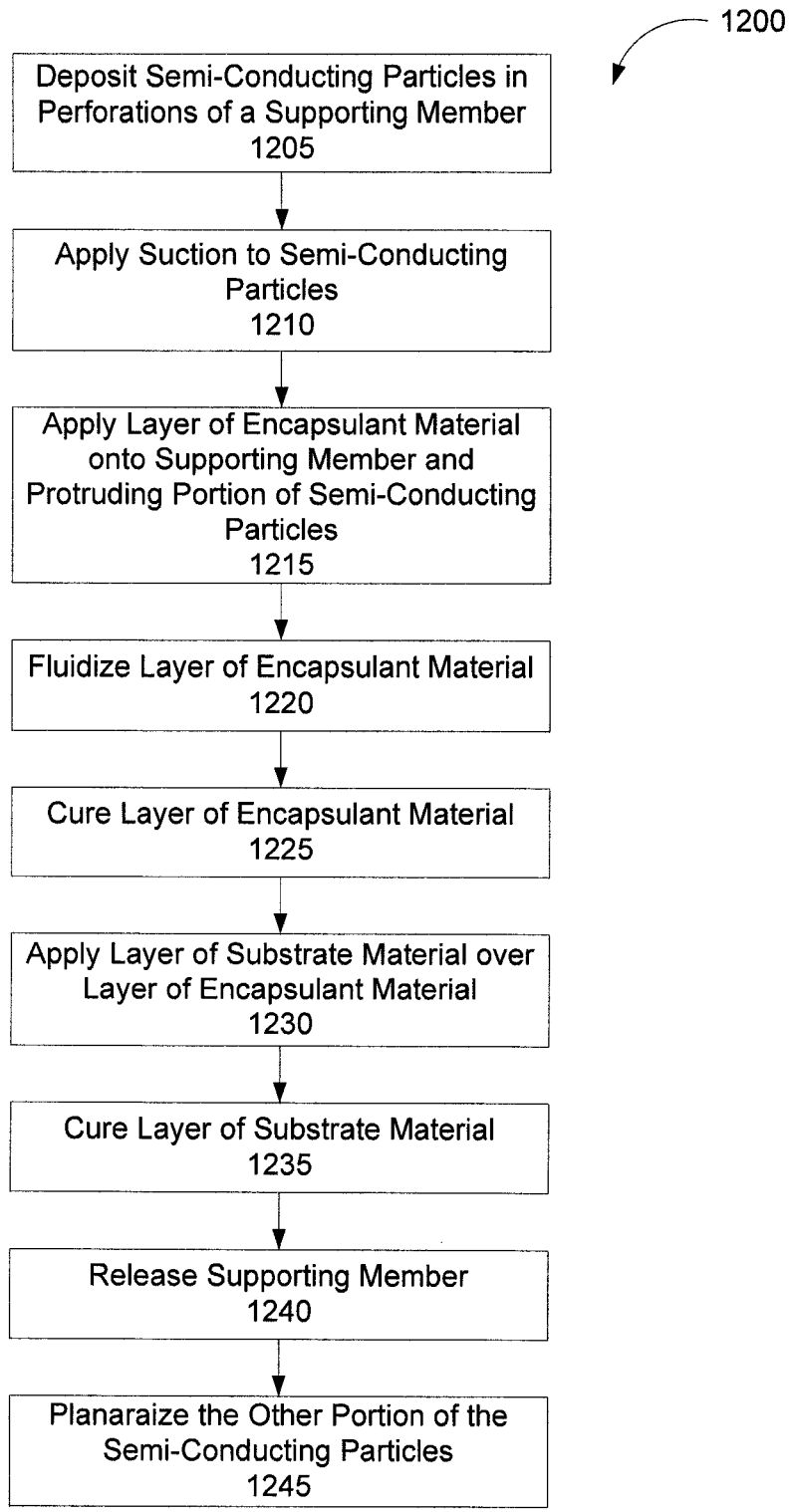
FIG. 12 depicts a flowchart of a method of manufacturing a semi-conducting backplane according to a second set of non-limiting implementations.

Attention is directed to FIG. 12, which depicts a method 1200 for manufacturing a semi-conducting backplane, according to non-limiting implementations. In order to assist in the explanation of method 1200, it will be assumed that method 1200 is performed using the elements described in FIGS. 7a, 7b, 7c, 10 and 11a to 11e. Furthermore, the following discussion of method 1200 will lead to a further understanding of the described elements. However, it is to be understood that the elements of FIGS. 7a, 7b, 7c, 10 and 11a to 11e and/or method 1200 can be varied, and need not work exactly as discussed herein in conjunction with each other, and that such variations are within the scope of present implementations.

It is to be emphasized, that method 1200 need not be performed in the exact sequence as shown, unless otherwise indicated; and likewise various blocks may be performed in parallel rather than in sequence; hence the elements of method 1200 are referred to herein as "blocks" rather than "steps".

At block 1205, semi-conducting particles 70 are deposited in perforations 71 of supporting member 72 such that portion 73 protrudes from supporting member 72. At block 1210, suction is applied to another portion 74 of the semi-conducting particles 70 to retain the semi-conducting particles 70 in perforations 71. According to some implementations, supporting member 72 is scanned and/or inspected to ensure semi-conducting particles 70a, 70b, 70c, 70d, 70e and 70f occupy respective perforations 71a, 71b, 71c, 71d, 71e and 71f. At block 1215, a layer of encapsulant material 76 is applied onto the supporting member 72 such that portion 73 is covered by the layer of encapsulant material 76.

According to some implementations, it is preferable to fluidize the layer of encapsulant material 76. Hence, at block 1220 of method 1200, the layer of encapsulant material 76 is fluidized. According to some implementations, fluidizing the layer of encapsulant material 76 comprises one of: melting the layer of encapsulant material 76 and polymerizing the layer of encapsulant material 76. However, according to some implementations, the layer of encapsulant material 76 already comprises a fluid, and hence block 1220 would not be performed.

At block 1225, the layer of encapsulant material 76 is cured to, for example, to promote hardening, solidification and/or promote adhesion between the semi-conducting particles 70 and the layer of encapsulant material 76.

At block 1230, a layer substrate material 111 is applied over the layer of encapsulant material 76. Similarly to the layer of encapsulant material 76, the layer of substrate material 111 can be cured at block 1235 to form assembly 112. Assembly 112 comprises the semi-conducting particles 70, the layer of encapsulant material 76 and the layer of substrate material 111.

At block 1240, the assembly 112 is released from the supporting member 72 in a manner similar to releasing assembly 77 described above.

At block 1245, other portion 74 the semi-conducting particles 70 of assembly 112 is planarized in a manner similar to planarizing semi-conducting particles 70 of assembly 77 above.

Figure 13:
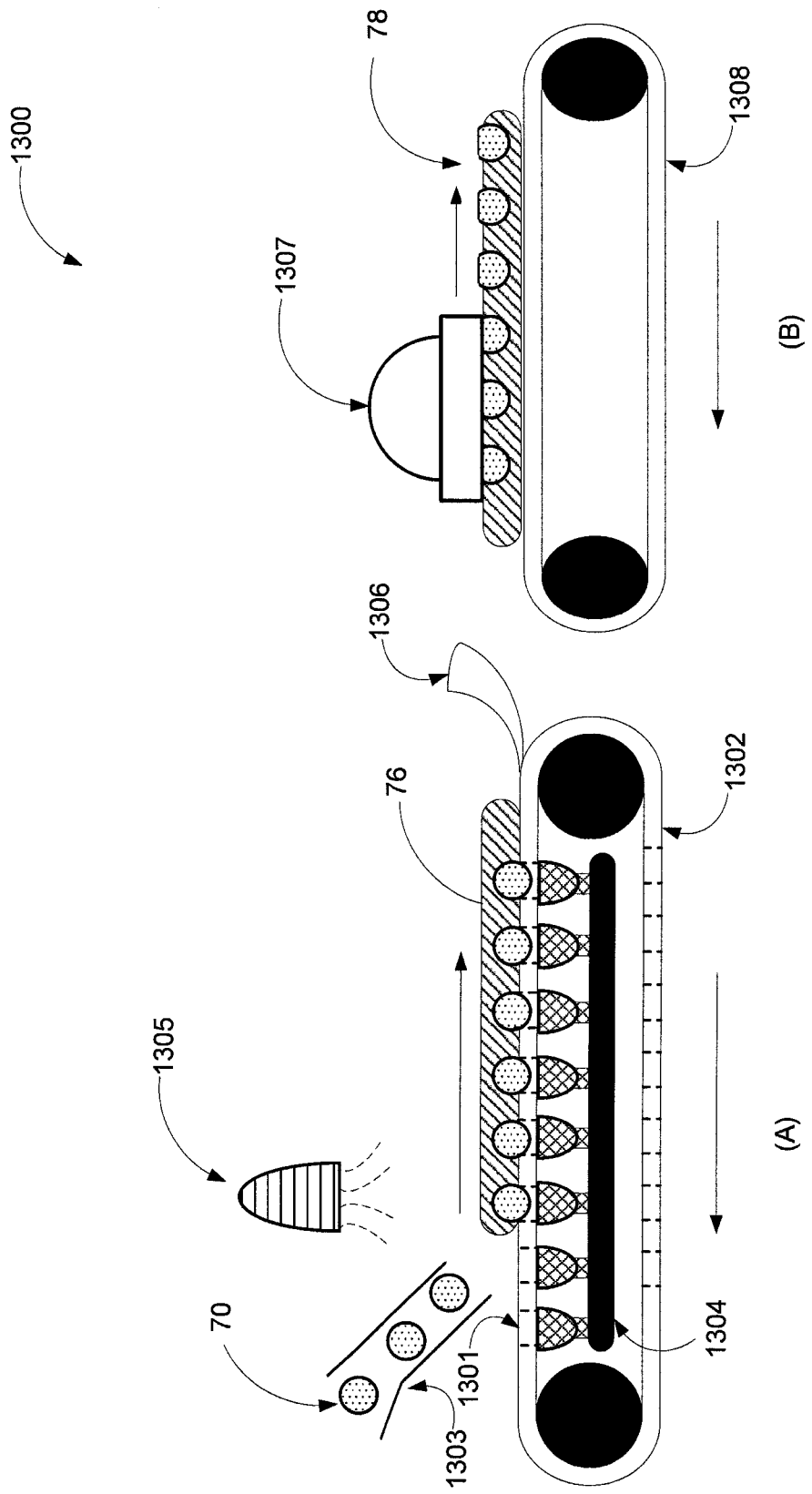
FIG. 13 depicts a system for manufacturing a semi-conducting backplane according to a second set of non-limiting implementations.

Attention is directed to FIG. 13, which depicts system 1300 for manufacturing a semi-conducting backplane, according to non-limiting implementations. In order to assist understanding, system 1300 is described in respect of manufacturing semi-conducting backplane 78. System 1300 is described in terms of stage (A) and stage (B). Stage (A) of system 1300 comprises a supporting member 1302 having perforations 1301 sized for receiving semi-conducting particles 70 such that a portion 73 protrudes from supporting member 1302. According to the implementation shown in FIG. 13, supporting member 1302 comprises a perforated conveyor. According to the implementation depicted in FIG. 13, semi-conducting particles 70 are deposited onto supporting member 1302 by siphon 1303, which is coupled to a hopper (not shown).

Suction apparatus 1304 is operatively coupled to the supporting member 1302 and applies suction to another portion 74 of the semi-conducting particles 70 to retain the semi-conducting particles 70 in perforations 1301. According to some implementations, suction apparatus 1304 comprises a vacuum apparatus.

Stage (A) of system 1300 further comprises an applicator for applying the layer of encapsulant material 76 onto the supporting member 1302 such that portion 73 of the semi-conducting particles 70 is covered by the layer of encapsulant material 76. According to some implementations, the applicator for applying the layer of encapsulant material 76 comprises one of: a sprayer, a roller and a press. As depicted in FIG. 13, the applicator for applying the layer of encapsulant material 76 in system 1300 comprises sprayer 1305.

According to some implementations, supporting member 1302 is heated to assist with curing of the layer of encapsulant material 76.

System 1300 further comprises a releasing apparatus for releasing assembly 77 of the semi-conducting particles 70 and the layer of encapsulant material 76 from supporting member 1302. According to the implementation depicted in FIG. 13, the releasing apparatus comprises lifter 1306 which gently lifts assembly 77 away from supporting member 1302 as assembly 77 traverses supporting member 1302 towards lifter 1306.

At stage (B) of system 1300, a planarizing apparatus planarizes other portion 74 of the semi-conducting particles 70. According to the implementation depicted in FIG. 13, assembly 77 traverses conveyor 1308 under planarizing apparatus, grinding machine 1307, and forms semi-conducting backplane 78.

Attention is directed to FIGS. 14*a* to 14*d* which depicts a method for manufacturing a semi-conducting backplane according to a second subset of the second set of implementations, according to non-limiting implementations, and in which in which like elements are denoted by like numbers in FIGS. 7*a* to 13. Substrate 140 has respective perforations 141*a*, 141*b*, 141*c*, 141*d*, 141*e* and 141*f*, also referred to herein as perforations 141. Perforations 141 are under suction, which, similar to the implementations depicted in FIGS. 7*a* to 13, is understood as generated by a pressure gradient force 142 (also referred to herein as pressure gradient forces 142*a*, 142*b*, 142*c*, 142*d*, 142*e* and 1420. The terms "suction" and "pressure gradient force" are used interchangeably herein. Pressure gradient force 142 or suction 142 is generated by a pressure differential between a region defined by perforations 141 and a lower pressure region in fluid communication with perforations 141. For example, the lower pressure region could be a low pressure chamber in a vacuum apparatus that is operatively coupled to substrate 140 and/or perforations 141.

Substrate 140 supports and joins semi-conducting particles 70 together (e.g. in cooperation with each other) in the semi-conducting backplane. According to some implementations, substrate 140 can be optically transmissive or opaque. According to some implementations, substrate 140 is divided into areas or zones of varying optical transmissibility and/or composition. As stated above, according to some implementations, multiple devices can be manufactured from the same semi-conducting backplane and divided into areas or zones for the respective devices. In such implementations, characteristics of substrate 140 can also be varied according to such zones, including the composition, optical transmissibility, and/or thickness.

Substrate 140 can take a variety of forms, such as a sheet of substrate material. A sheet of substrate 140 can be formed on a roll or conveyor by spraying or depositing the substrate material on the surface of the roll or conveyor. If desired, the substrate material can be melted or polymerized. Substrate 140 can also comprise a variety of substances. According to some implementations, substrate 140 comprises one of: glass, plastic, flex-glass and plastic. For example, substrate 140 can comprise a flexible sheet of glass.

The form and composition of substrate 140 can be varied based on desired characteristics of the semi-conducting backplane. A flexible semi-conducting backplane may be desirable to facilitate transportation. For example, according to some implementations, the semi-conducting backplane is flexible enough to be rolled. In rolled form, the semi-conducting backplane may take up less space per unit surface area than a typical rigid panel and hence is easier to transport. According to some implementations, substrate 140 can be fabricated to promote flexibility in the semi-conducting backplane by making substrate 140 thin relative to other dimensions of substrate 140 (e.g. length and width) and/or choosing a substance that promotes flexibility, such as a flexible polymer. According to some implementations, substrate 140 comprises a flexible sheet of glass of approximately 100 μm thick. According to some implementations, one or more of substrate 140 and semi-conducting backplane 147, are fabricated as a roll as part of a continuous process.

According to some implementations, semi-conducting backplane 147 forms part of a display that is to be formed onto the interior of a curved surface. According to these implementations, substrate 140 may be a sufficiently flexible sheet that could be deformed during processing, such that substrate 140 later relaxes into a curved (i.e. non-planar shape). According to some implementations, semi-conducting backplane 147, and the accompanying electronics, are formed using planar processes, such as lithography. Hence, according to some implementations, in manufacturing a display on a large sphere, the semi-conducting backplane 147, and substrate 140, is fabricated as a planar projection of the sphere and then wrapped around the sphere or worked into the shape of the sphere.

Figure 14A:
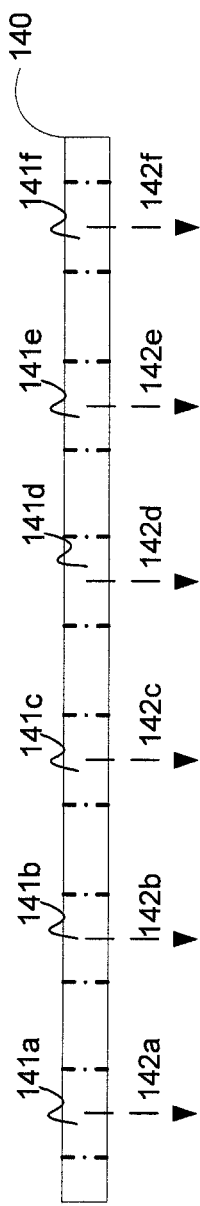
FIGS. 14a to 14d depict a method for manufacturing a semi-conducting backplane according to a second set of non-limiting implementations.
Figure 14B:
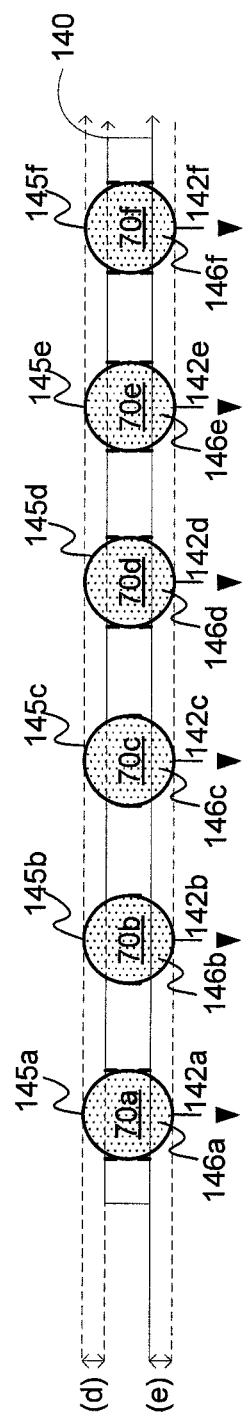
Figure 14C:
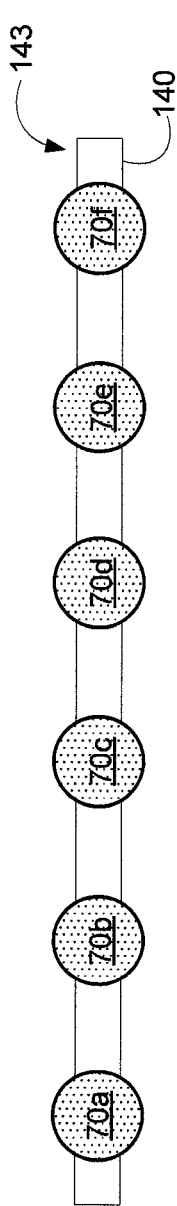

As depicted in FIG. 14b, semi-conducting particles 70 are deposited in perforations 141 such that a portion 145 of the semi-conducting particles 70 (also referred to herein as portions 145a, 145b, 145c, 145d, 145e and 145f) protrudes from the substrate 140. According to some implementations, semi-conducting particles 70 can be deposited in perforations 141 by mechanical vibration of substrate 140. Semi-conducting particles 70 can also be deposited in perforations 141 by individually placing each of semi-conducting particles 70a, 70b, 70c, 70d, 70e and 70f in respective perforations 141a, 141b, 141c, 141d, 141e and 141f. However, this list is not exhaustive and any suitable means of depositing the semi-conducting particles 70 in perforations 141 is contemplated.

Perforations 141 are sized to receive semi-conducting particles 70 such that semi-conducting particles 70 do not pass through perforations 141. In the depicted implementation, substrate 140 is sized such that both portion 145 and portion 146 of semi-conducting particles 70 protrude from substrate 140. According to some implementations, only one of portion 145 and portion 146 protrude from substrate 140.

The amount portion 145 and/or portion 146 protrude from substrate 140, such as a distance (d) or (e), may depend on the application for the semi-conducting backplane, configuration and/or design requirements for the device utilizing the semi-conducting backplane.

Furthermore, the number and arrangement of perforations 141 across substrate 140 can vary. According to some implementations, perforations 141 comprise a single perforation (such as respective perforation 141a). According to some implementations, perforations 141 are uniformly spaced across substrate 140. According to some implementations, perforations 141 are arranged non-uniformly across substrate 140. According to some implementations, perforations 141 are positioned at pre-determined locations across substrate 140. For example, if the semi-conducting backplane will be used to manufacture a display, perforations 141 will be located at positions where transistors or other electrical connections would be connected to the semi-conducting particles 70.

Perforations 141 can be fabricated or inherent to substrate 140. According to some implementations, perforations 141 can be mechanically formed by cutting or punching through substrate 140. According to some implementations, perforations 141 are formed as part of a casting process used to create substrate 140. According to some implementations, perforations 141 are formed by chemical etching. According to some implementations, perforations 141 comprise inherent holes or pits in substrate 140.

According to some implementations, perforations 141 have varying sizes and shapes. Perforations 141 are arranged in any manner suitable for application, manufacture and/or transportation of the semi-conducting backplane. According to some implementations, multiple devices are to be manufactured from the same semi-conducting backplane. In such implementations, the semi-conducting backplane may be divided into areas or zones representing each respective device. If the devices are disparate devices (e.g. different dimensions, emission requirements, power requirements, etc.), each area or zone may require semi-conducting particles of different sizes, compositions and/or shapes. Hence, in these implementations, perforations 141 may be differently arranged in each zone. The semi-conducting backplane may then be separated according to each area or zone, by, for example, cutting up the semi-conducting backplane, for further manufacturing of the respective device.

Semi-conducting particles 70 are retained in perforations 141 by the pressure gradient force 142 (also referred to herein as suction 142). As depicted in FIGS. 14a and 14b, pressure gradient force 142 draws or compels semi-conducting particles 70 towards and into perforations 141, which helps prevent the semi-conducting particles 70 from being released or moving out of respective perforations 141a, 141b, 141c, 141d, 141e and 141f.

Substrate 140 is adhered to semi-conducting particles 70 to form an assembly 143 (depicted in FIG. 14c) of substrate 140 and semi-conducting particles 70. Any suitable manner to affix the semi-conducting particles 70 to the substrate 140 at the locations of perforations 141 is contemplated. According to some implementations, adhering substrate 140 to semi-conducting particles 70 comprises one or more of: applying an adhesive to the perforations 141; applying an adhesive to the semi-conducting particles 70; heating the substrate 140; and curing the substrate 140. According to some implementations, one or more of the substrate 140 and the semi-conducting particles 70 is treated to promote adhesion to the semi-conducting particles 70. For example, an adhesive, such as a glue or epoxy, is applied to one or more of the inside walls of perforations 141 and the semi-conducting particles 70. As another example, substrate 140 can be heated to soften the substrate 140 around semi-conducting particles 70.

Figure 14D:
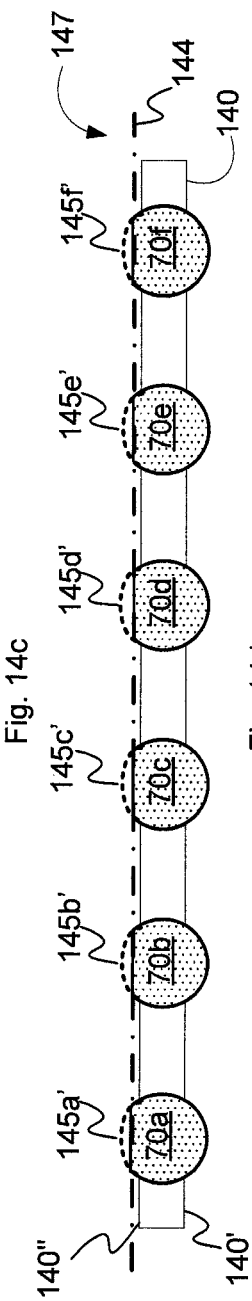

As depicted in FIG. 14d, at least a part of portion 145 of semi-conducting particles 70 is planarized to form the semi-conducting backplane 147. The amount of part of other portion 145 removed by planarizing, denoted by 145', may depend on the application of the semi-conducting backplane 147, including the electrical connections that may be made to the semi-conducting particles 70. A variety of planarizing techniques a can be utilized. According to some implementations, the planarizing comprises chemical mechanical planarization (CMP). According to some implementations, the planarizing comprises sanding or grinding the semi-conducting particles 70. According to some implementations, the semi-conducting particles 70 are further processed by laser recrystallization after planarizing.

According to some implementations, the planarized portion lies in one of: a plane parallel to substrate 140 and a plane in-plane (i.e. co-planar) with substrate 140. For example, as depicted in FIG. 14d, semi-conducting particles 70 are planarized along plane 144, which is parallel to at least one of surfaces 140' and 140" of substrate 140. According to some implementations, semi-conducting particles 70 are planarized along two planes, a first plane parallel to or co-planar with surface 140' and a second plane parallel to or co-planar with surface 140". Planarizing semi-conducting particles 70 on both sides exposes semi-conducting surfaces of semi-conducting particles 70 on both surfaces of substrate 140, allowing for fabrication of devices, interconnects and electrical vias to be formed on both sides of the device. For example, electronics could be placed on one planarized surface of semi-conducting particles 70, and active contact pads (such as contact pads with ESD protection and drive transistors) on the other planarized surface of semi-conducting particles 70, where the two planarized surfaces are connected by electrical vias made in the semiconductor or in the surrounding substrate 140. The resulting overall device is more compact as area normally used for contact pads can now be used for circuitry.

Furthermore, the electrical devices can be diced to form individual die. The contact pads are not necessarily be wire bond pads, but can be used for die-attach, ball bonds, or other standard method to directly attach to a printed circuit board (PCB).

According to one related implementation, electrical devices formed using semi-conducting backplane 147 can be diced to form individual die, and after attachment to a PCB or other carrier, substrate 140 can be subsequently removed, by any convenient means such as dissolving or melting substrate leaving behind the now smaller, mounted and electrically connected device.

According to some implementations, the electrical dices or semi-conducting backplanes can be stacked.

Figure 15:
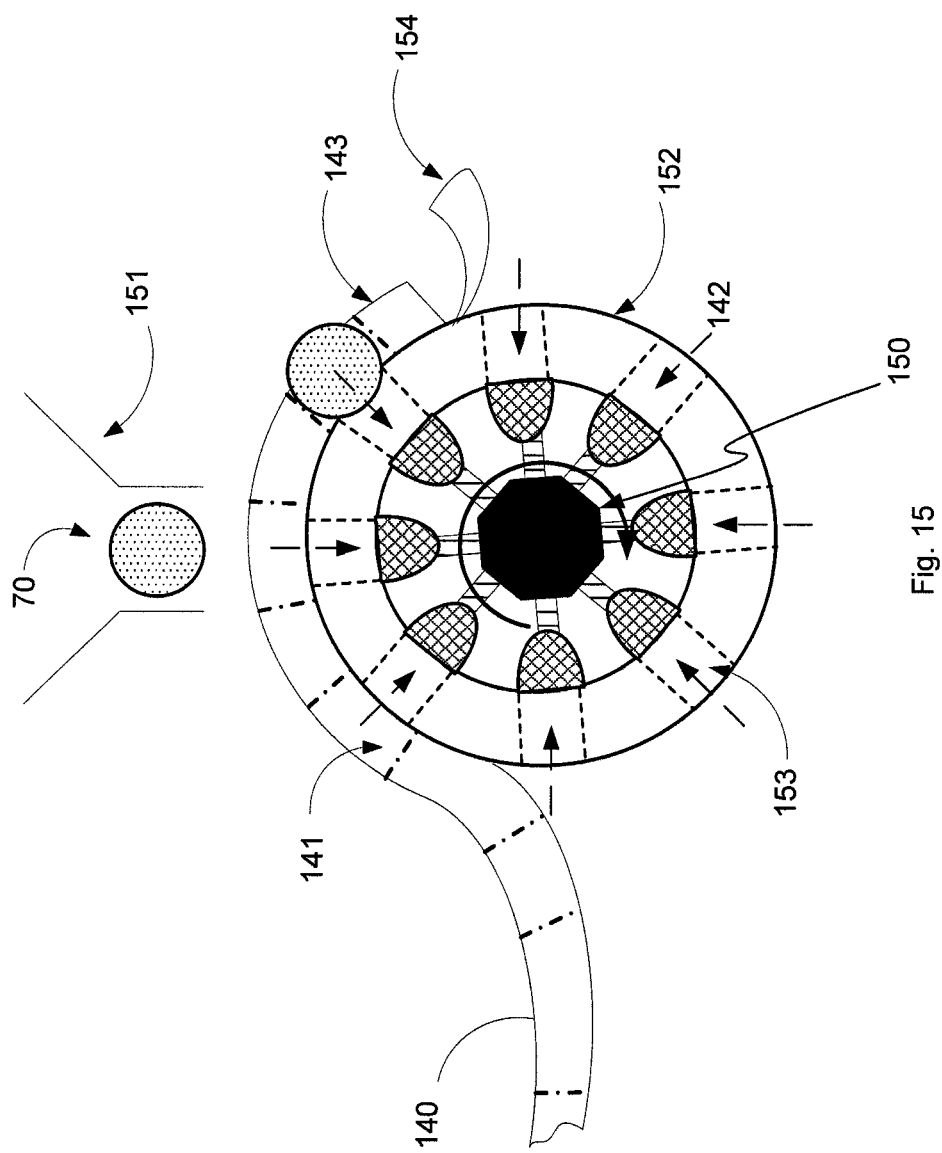
FIG. 15 depicts a supporting member for manufacturing a semi-conducting backplane, according to a second set of non-limiting implementations.

As depicted in FIG. 15, in which like elements are denoted by like numbers in FIGS. 7a to 14, substrate, 140 can be provided to supporting member 152. Supporting member 152 is configured to apply suction 142 to perforations 141 of substrate 140, via a vacuum apparatus 150 operatively coupled to perforations 153 in supporting member 152. Semi-conducting particles 70 are deposited into perforations 141 by siphon 151, which is coupled to a hopper (not shown), while supporting member 152 is rotated.

Supporting member 152 is used as a supporting structure for substrate 140 and provides suction 142 to the perforations 141 to retain semi-conducting particles 70 in the perforations 141. Similarly to supporting members 72, 82a, 82b, 82c, 92 and 1302, Supporting member 152 can comprise various shapes, configurations and sizes. According to some implementations, supporting member 152 comprises one of a hollow cylinder or drum, a substantially solid cylinder or drum, a planar member, a curved member and a conveyor member. According to some implementations, supporting member 152 comprises one of supporting members 72, 82a, 82b, 82c, 92 and 1302.

Supporting member 152 can comprise a variety of materials. For example, supporting member can comprise one of steel and ceramic. The application for the semi-conducting backplane, the particular manufacturing conditions and the "heat budget" or temperature constraints of the materials used to form the semi-conducting backplane would likely inform the choice material of supporting member 152.

For example, according to some implementations, supporting member 152 can be heated to melt substrate 140 to adhere substrate 140 to semi-conducting particles 70 to form assembly 143. In such implementations, supporting member 152 may comprise a thermally conductive element.

According to some implementations, perforations 141 in substrate 140 and perforations 153 in supporting member 152 do not align with each other or are offset with respect to each other. According to some implementations, perforations 153 comprise channels or slots. According to some implementations, perforations 153 are sized larger than perforations 141 in substrate 140. For example, in some implementations, substrate 140 is thick enough to be in self-supported suspension over perforations 153 such that substrate 140 does not substantially bow or warp due to suction 142. As depicted in FIG. 15, according to some implementations, perforations 153 are sized smaller than perforations 141 in substrate 140. Any configuring of supporting member 153 that enables supporting member 152 to provide suction 142 to perforations 141 of substrate 140 is contemplated.

The assembly 143 comprising the substrate 140 and the semi-conducting particles 70 can be released from the supporting member 152. As described in respect of releasing supporting member 72, the "releasing" can comprise separating the supporting member 152 from the assembly 143 or vice-versa (separating the assembly 143 from supporting member 152). For example, as depicted in FIG. 15, lifter 154 can be used to gently lift assembly 143 away from supporting member 152 as assembly 143 traverses towards lifter 154.

According to some implementations, the supporting member 152 can be removed in pieces, rather than as a single piece. For example, if the semi-conducting backplane is being used to fabricate multiple devices, in some related implementations the supporting member 152 may be released as areas or zones of the assembly 143 associated with the semi-conducting backplane are being utilized. Depending on how supporting member 152 is released and/or the strength of suction or pressure gradient force 142, suction 142 may be removed prior to releasing the supporting member 152. According to some implementations, assembly 143 can be scribed or diced according those areas or zones, which may be performed in-situ.

In order to facilitate the releasing, prior to providing substrate 140 to supporting member 152, supporting member 152 may be treated with a substance or composition to promote releasing (herein also referred to as a "releasant"). For example, supporting member 152 may be coated with a non-stick coating, such as Teflon® of DuPont (E.I. du Pont de Nemours).

Furthermore, in some implementations, thermal treatments, such as heating or cooling of supporting member 152, can be used to take advantage of differential rates of thermal expansion between the assembly 143 and supporting member 152 to separate them.

As in the first subset of implementations described in respect of FIGS. 7a to 13, the second subset of implementations provides many benefits over prior art methods. In some prior art methods, the semi-conducting particles are completely enveloped by the substrate and therefore require use of lithography or other techniques to carefully remove enough of the substrate to expose the semi-conducting particles without damaging any of the semi-conducting particles. Implementations of the described methods and systems therefore obviate this additional step, by ensuring that at least a portion of the semi-conducting particles is not adhered to or covered by the substrate. As a result, the described methods and systems of the second set of implementations can lead to reduced manufacturing costs in comparison to those prior art methods.

Figure 16:
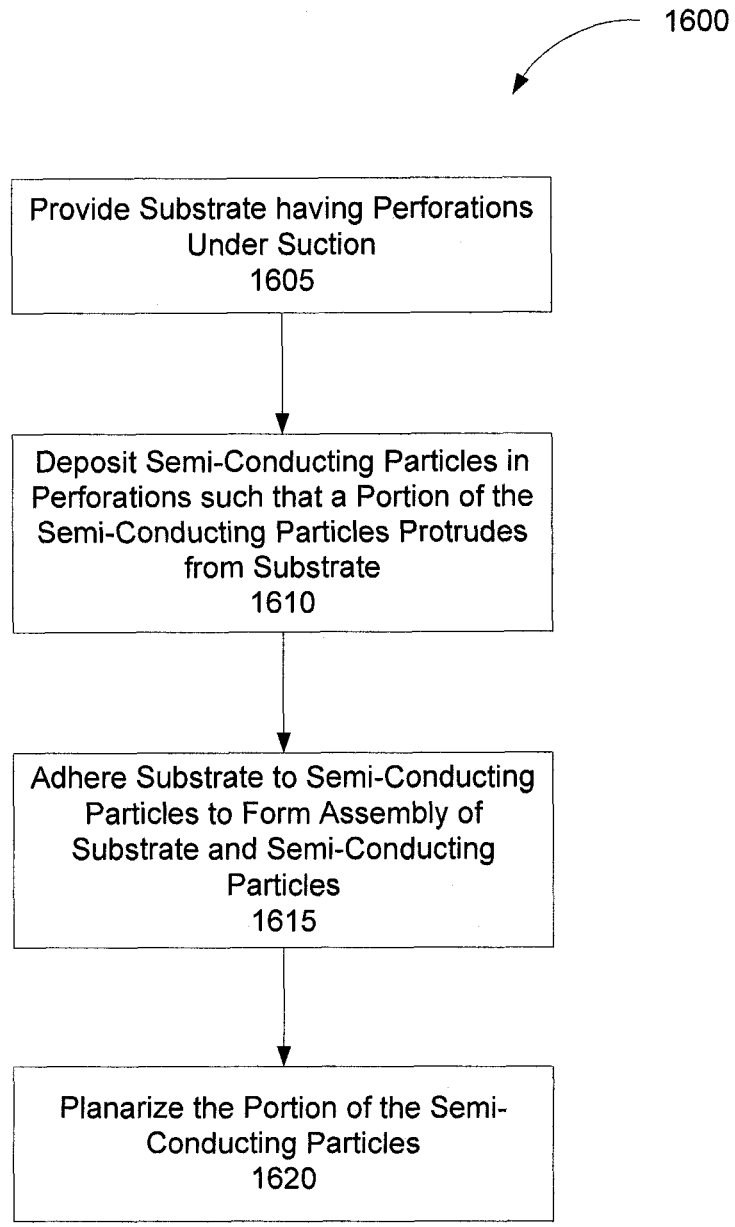
FIG. 16 depicts a flowchart of a method for manufacturing a semi-conducting backplane, according to a second set of non-limiting implementations.

Attention is directed to FIG. 16, which depicts a method 1600 for manufacturing a semi-conducting backplane, according to non-limiting implementations. In order to assist in the explanation of method 1600, it will be assumed that method 1600 is performed using the elements described in FIGS. 14a to 15. Furthermore, the following discussion of method 1600 will lead to a further understanding of the described elements. However, it is to be understood that the elements of FIGS. 14a to 15 and/or method 1600 can be varied, and need not work exactly as discussed herein in conjunction with each other, and that such variations are within the scope of present implementations.

It is to be emphasized, that method 1600 need not be performed in the exact sequence as shown, unless otherwise indicated; and likewise various blocks may be performed in parallel rather than in sequence; hence the elements of method 1600 are referred to herein as "blocks" rather than "steps".

At block 1605, substrate 140 having perforations 141 under suction 142 is provided. As described above, according to some implementations, substrate 140 can be provided to supporting member 152 configured to provide suction 142 to perforations 141.

At block 1610, semi-conducting particles 70 are deposited in perforations 141 such that a portion 145 (alternatively, portion 146) protrudes from substrate 140. Semi-conducting particles 70 are retained in perforations 141 by suction 142. According to some implementations, substrate 140 is scanned and/or inspected to ensure semi-conducting particles 70*a*, 70*b*, 70*c*, 70*d*, 70*e* and 70*f* occupy respective perforations 141*a*, 141*b*, 141*c*, 141*d*, 141*e* and 141*f*.

At block 1615, substrate 140 is adhered to semi-conducting particles 70 to form assembly 143 of substrate 140 and semi-conducting particles 70. According to some implementations, adhering substrate 140 to semi-conducting particles 70 comprises at least one of: applying an adhesive to perforations 141; applying an adhesive to semi-conducting particles 70; heating substrate 140; curing substrate 140; and fusing an oxide layer on the semi-conducting particles 70 to substrate 140.

At block 1620, portion 145 (alternatively or additionally, portion 146) of semi-conducting particles 70 is planarized.

Figure 17:
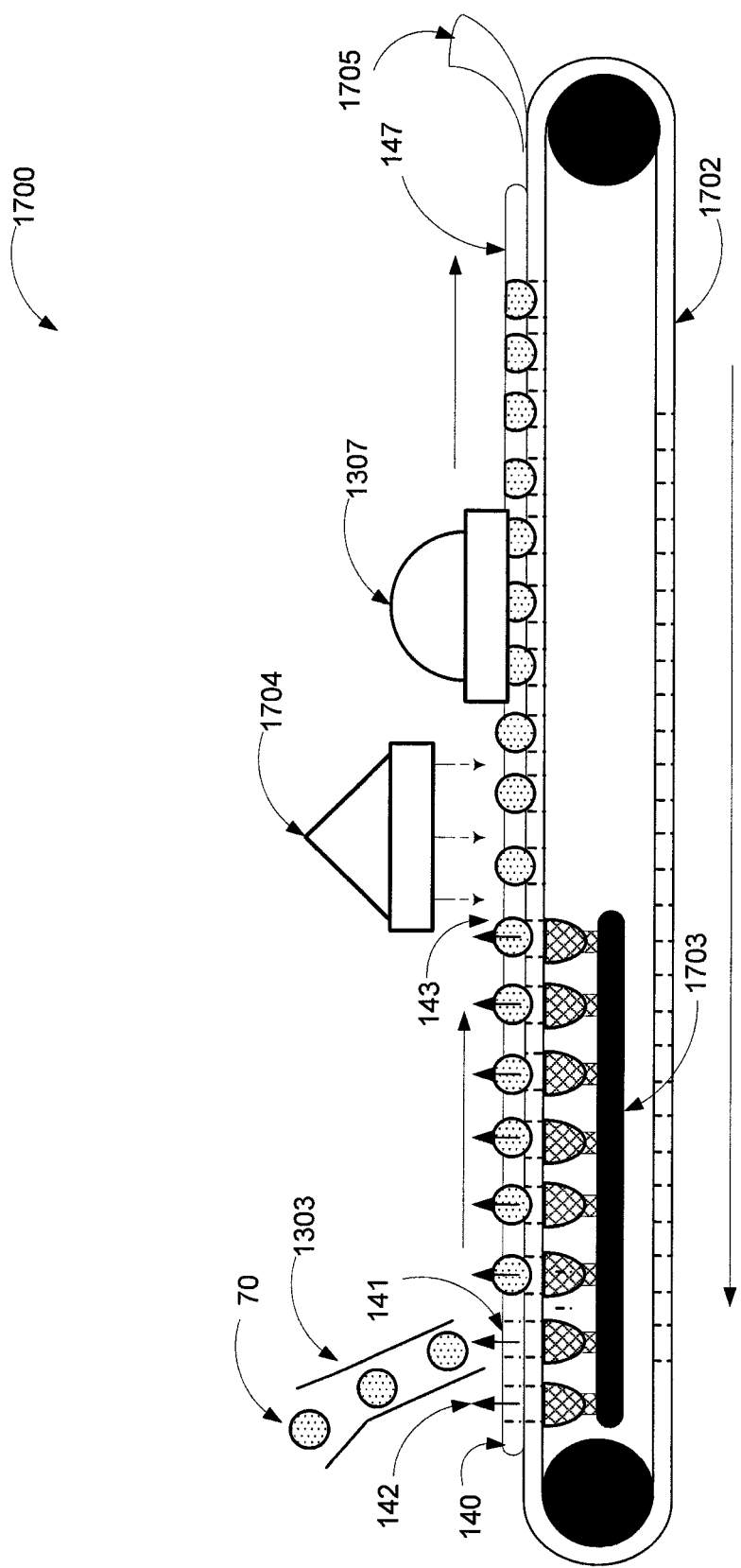
FIG. 17 depicts a system for manufacturing a semi-conducting backplane, according to a second set of implementations.

Attention is directed to FIG. 17, which depicts system 1700 for manufacturing a semi-conducting backplane, according to non-limiting implementations, and in which like elements from FIGS. 7*a* to 15 are given like numbers. In order to assist understanding, system 1700 is described in respect of manufacturing semi-conducting backplane 147.

Working from left to right, substrate 140 having perforations 141, is provided to a supporting member, which comprises perforated conveyor 1702. Perforated conveyor 1702, being operatively coupled to vacuum apparatus 1703, is configured to provide suction 142 to perforations 141.

According to the implementation depicted in FIG. 17, semi-conducting particles 70 are deposited onto substrate 140 by siphon 1303, which is coupled to a hopper (not shown). Semi-conducting particles 70 are deposited in perforations 141 and are retained by suction 142 such that a portion 146 protrudes from substrate 140. According to some implementations, semi-conducting particles 70 are sucked up from a bin or pile and then deposited onto substrate 140, into perforations 141.

System 1700 further comprises an apparatus for adhering substrate 140 to the semi-conducting particles 70 to form an assembly 143 of substrate 140 and semi-conducting particles 70. As depicted in FIG. 17, system 1700 comprises heat lamp 1704 to heat substrate 140 such that substrate 140 melts and adheres to the semi-conducting particles 70. According to some implementations, the apparatus for adhering substrate 140 to the semi-conducting particles 70 comprises a sprayer. For example, according to some implementations, substrate 140 is sprayed with a substance to promote adherence of substrate 140 with semi-conducting particles 70.

System 1700 further comprises a planarizing apparatus, grinding machine 1307, for planarizing portion 145 of the semi-conducting particles 70. According to the implementation depicted in FIG. 17, assembly 143 traverses perforated conveyor 1702 under grinding machine 1307 to form semi-conducting backplane 147.

System 1700 further comprises a releasing apparatus for releasing assembly 143 from the supporting member, perforated conveyor 1702. According to the implementation depicted in FIG. 17, the releasing apparatus comprises lifter 1705 which gently lifts semi-conducting backplane 147 away from perforated conveyor 1702 as the semi-conducting backplane 147 traverses perforated conveyor 1702 towards lifter 1705.

The methods, systems and devices herein described can provide a simple, scalable and cost-effective manner to manufacture semi-conducting backplanes. These semi-conducting backplanes can be used in a wide variety of applications in which a supported semi-conductor is required, such as displays and solar panels. The described methods, systems and devices may be particularly beneficial where the device size is large in comparison to the semi-conductor size.

As a scalable manner in which to manufacture semi-conducting backplanes, the described methods and systems can be, according to some implementations, used to manufacture semi-conducting backplanes comprised of a single pixel to semi-conducting backplanes comprised of thousands of pixels. Furthermore, as described above, some implementations enable multiple, disparate devices to be manufactured from the same semi-conducting backplane by modifying one or more of the placement of the semi-conducting particles across the layer of encapsulant material or substrate, and the composition of the layer of encapsulation material and/or the layer of substrate material and or the substrate according to areas or zones designated for certain devices. The manufactured semi-conducting backplane can then be diced or apportioned according to those areas or zones. This allows for greater flexibility and adaptability in the manufacturing process, which can lead to reduced manufacturing costs.

Furthermore, as described above, the described methods and systems can enable tailoring the semi-conducting backplane for other concerns, such as transport. For example, the composition and form of the layer of encapsulant material can be created to promote flexibility in the semi-conducting backplane. This flexibility, according to some implementations, may allow for the semi-conducting backplane to be stored and/or transported in rolled form. In comparison to large, rigid semi-conducting backplanes, the rolled semi-conducting backplane likely takes up less space and may not require specialized storage or transportation means. Hence, implementations may lead to reduced storage and transportation costs.

Furthermore, in respect of the second set of implementations, since the semi-conducting particles are positioned by the supporting member (e.g. supporting member 72) or the substrate (e.g. substrate 140), there is no need for a formal matrix or grid to position the semi-conducting particles.

As stated above, in respect of the second set of implementations, since the semi-conducting particles are not completely embedded or enveloped by the supporting material (e.g. the layer of encapsulant material 76, substrate 140), it is not necessary to remove some of this material to reveal a part of the semi-conducting particles for further manufacture. This can also reduce manufacturing costs. Furthermore, since at least a part of the semi-conducting particles protrudes from the semi-conducting backplane, the supporting material does not need to be transparent in order to see the semi-conducting particles.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A method for manufacturing a semi-conducting backplane comprising:

depositing semi-conducting particles in perforations of a supporting member such that a portion of the semi-conducting particles protrudes from the supporting member;

applying suction to another portion of the semi-conducting particles to retain the semi-conducting particles in the perforations;

applying a layer of encapsulant material onto the supporting member such that the portion of the semi-conducting particles is covered by the layer of encapsulant material;

removing the supporting member to reveal an assembly of the semi-conducting particles and the layer of encapsulant material; and planarizing the other portion of the semi-conducting particles.

2. The method of claim 1, wherein the other portion lies in one of: a plane parallel to the layer of encapsulant material and a plane co-planar with the layer of encapsulant material.

3. The method of claim 1, wherein planarizing comprises chemical-mechanical planarization (CMP).

4. The method of claim 1, wherein applying the layer of encapsulant material comprises at least one of: spraying the encapsulant material onto the supporting member, pouring the encapsulant material onto the supporting member, spreading the encapsulant material onto the supporting member, rolling the encapsulant material onto the supporting member, pressing the encapsulant material onto the supporting member, electrostatically coating the supporting member with the encapsulant material and vacuum forming the layer of encapsulant material onto the supporting member.

5. The method of claim 1, wherein the layer of encapsulant material comprises at least one of: a fluid, a powder and a sheet.

6. The method of claim 1, wherein the layer of encapsulant material comprises at least one of: glass, plastic and optically curable cement.

7. The method of claim 1 further comprising:
prior to the removing, applying a layer of substrate material over the layer of encapsulant material.

8. The method of claim 7, wherein the assembly further includes the layer of substrate material.

9. The method of claim 7, wherein the layer of substrate material comprises at least one of: glass, flex-glass and plastic.

10. The method of claim 1 further comprising: removing the layer of encapsulant material after the planarizing.

11. A method for manufacturing a semi-conducting backplane comprising:
providing a substrate having perforations under suction;
depositing semi-conducting particles in the perforations such that a portion of the semi-conducting particles protrudes from the substrate, the semi-conducting particles being retained in the perforations by the suction;
adhering the substrate to the semi-conducting particles to form an assembly of the substrate and the semi-conducting particles; and
planarizing the portion of the semi-conducting particles.

12. The method of claim 11, wherein the substrate is provided to a supporting member configured to apply the suction to the perforations.

13. The method of claim 12, further comprising: removing the assembly from the supporting member.

14. The method of claim 12, wherein the supporting member comprises one of a planar member, a conveyor or a drum.

15. The method of claim 11, wherein the planarized portion lies in one of: a plane parallel to the substrate of the assembly and a plane co-planar with the substrate of the assembly.

16. The method of claim 11, wherein planarizing comprises chemical-mechanical planarization (CMP).

17. The method of claim 11, wherein adhering the substrate to the semi-conducting particles comprises at least one of: applying an adhesive to the perforations; applying an adhesive to the semi-conducting particles; heating the substrate; curing the substrate; and fusing an oxide layer on the semi-conducting particles to the substrate.

18. The method of claim 11, wherein the semi-conducting particles comprise silicon spheres.

19. The method of claim 11, wherein the substrate comprises at least one of: glass, flex-glass and plastic.

20. The method of claim 11, further comprising: removing the substrate after the planarizing.

* * * * *